United States Patent
Zhang et al.

(10) Patent No.: US 10,553,497 B2
(45) Date of Patent: Feb. 4, 2020

(54) METHODS AND DEVICES FOR ENHANCING MOBILITY OF CHARGE CARRIERS

(71) Applicant: STMICROELECTRONICS, INC., Coppell, TX (US)

(72) Inventors: John H. Zhang, Altamont, NY (US); Chengyu Niu, Niskayuna, NY (US); Heng Yang, Fishkill, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 15/276,516

(22) Filed: Sep. 26, 2016

(65) Prior Publication Data
US 2017/0011971 A1    Jan. 12, 2017

Related U.S. Application Data

(62) Division of application No. 13/856,325, filed on Apr. 3, 2013, now Pat. No. 10,438,856.

(51) Int. Cl.
*H01L 21/70* (2006.01)
*H01L 21/8238* (2006.01)
(Continued)

(52) U.S. Cl.
CPC .. *H01L 21/823842* (2013.01); *H01L 21/2855* (2013.01); *H01L 21/28088* (2013.01);
(Continued)

(58) Field of Classification Search
CPC ............... H01L 29/495; H01L 29/4966; H01L 29/7843; H01L 21/823842;
(Continued)

(56) References Cited

U.S. PATENT DOCUMENTS

| 6,166,417 A | 12/2000 | Bai et al. |
| 6,284,605 B1 | 9/2001 | Kim et al. |

(Continued)

FOREIGN PATENT DOCUMENTS

| CN | 102130057 A | 7/2011 |
| CN | 102376582 A | 3/2012 |

OTHER PUBLICATIONS

U.S. Appl. No. 13/856,325, filed Apr. 3, 2013, Methods and Devices for Enhancing Mobility of Charge Carriers.

(Continued)

*Primary Examiner* — Ismail A Muse
(74) *Attorney, Agent, or Firm* — Seed Intellectual Property Law Group LLP

(57) ABSTRACT

Methods and devices for enhancing mobility of charge carriers. An integrated circuit may include semiconductor devices of two types. The first type of device may include a metallic gate and a channel strained in a first manner. The second type of device may include a metallic gate and a channel strained in a second manner. The gates may include, collectively, three or fewer metallic materials. The gates may share a same metallic material. A method of forming the semiconductor devices on an integrated circuit may include depositing first and second metallic layers in first and second regions of the integrated circuit corresponding to the first and second gates, respectively.

20 Claims, 10 Drawing Sheets

(51) Int. Cl.
| | |
|---|---|
| H01L 29/423 | (2006.01) |
| H01L 29/49 | (2006.01) |
| H01L 21/28 | (2006.01) |
| H01L 29/78 | (2006.01) |
| H01L 21/285 | (2006.01) |
| H01L 29/417 | (2006.01) |
| H01L 29/66 | (2006.01) |
| H01L 27/092 | (2006.01) |

(52) U.S. Cl.
CPC .. *H01L 21/28132* (2013.01); *H01L 21/82385* (2013.01); *H01L 21/823807* (2013.01); *H01L 21/823814* (2013.01); *H01L 21/823864* (2013.01); *H01L 27/092* (2013.01); *H01L 29/41783* (2013.01); *H01L 29/42376* (2013.01); *H01L 29/495* (2013.01); *H01L 29/4958* (2013.01); *H01L 29/66545* (2013.01); *H01L 29/7845* (2013.01); *H01L 29/7843* (2013.01)

(58) Field of Classification Search
CPC .......... H01L 29/66545; H01L 29/4958; H01L 27/092–0928; H01L 21/8238–823892
See application file for complete search history.

(56) References Cited

U.S. PATENT DOCUMENTS

| | | | |
|---|---|---|---|
| 6,373,111 B1 | 4/2002 | Zheng et al. | |
| 6,432,763 B1 | 8/2002 | Yu | |
| 6,448,140 B1 | 9/2002 | Liaw | |
| 6,525,378 B1 | 2/2003 | Riccobene | |
| 6,750,519 B2 | 6/2004 | Lin et al. | |
| 7,173,312 B2 | 2/2007 | Cabral, Jr. et al. | |
| 7,427,794 B2 | 9/2008 | Chau et al. | |
| 7,456,476 B2 | 11/2008 | Hareland et al. | |
| 7,732,878 B2 | 6/2010 | Yao et al. | |
| 7,902,058 B2 | 3/2011 | Datta et al. | |
| 7,952,147 B2 | 5/2011 | Ueno et al. | |
| 7,968,957 B2 | 6/2011 | Murthy et al. | |
| 7,973,389 B2 | 7/2011 | Rios et al. | |
| 8,120,073 B2 | 2/2012 | Rakshit et al. | |
| 8,129,795 B2 | 3/2012 | Datta et al. | |
| 8,298,875 B1 | 10/2012 | Or-Bach et al. | |
| 2005/0029601 A1 | 2/2005 | Chen et al. | |
| 2006/0008968 A1* | 1/2006 | Brask ............... H01L 21/28185 438/206 |
| 2006/0043424 A1 | 3/2006 | Bowen et al. | |
| 2006/0065939 A1 | 3/2006 | Doczy et al. | |
| 2006/0071285 A1 | 4/2006 | Datta et al. | |
| 2006/0148151 A1 | 7/2006 | Murthy et al. | |
| 2007/0005949 A1 | 1/2007 | Ho et al. | |
| 2007/0072378 A1 | 3/2007 | Wu et al. | |
| 2007/0096220 A1 | 5/2007 | Kim et al. | |
| 2007/0138559 A1 | 6/2007 | Bohr | |
| 2007/0221979 A1 | 9/2007 | Caspary et al. | |
| 2008/0014721 A1 | 1/2008 | Bauer | |
| 2008/0096338 A1* | 4/2008 | Zhang ............ H01L 21/823807 438/197 |
| 2008/0308872 A1 | 12/2008 | Bu et al. | |
| 2009/0079014 A1 | 3/2009 | Sandford et al. | |
| 2009/0090976 A1 | 4/2009 | Kavalieros et al. | |
| 2009/0108378 A1 | 4/2009 | Zhu et al. | |
| 2009/0184374 A1* | 7/2009 | Clevenger ......... H01L 21/31144 257/368 |
| 2009/0256173 A1 | 10/2009 | Chen et al. | |
| 2009/0294807 A1 | 12/2009 | Yan et al. | |
| 2009/0309646 A1 | 12/2009 | Kobayashi et al. | |
| 2010/0072553 A1 | 3/2010 | Xu et al. | |
| 2010/0109131 A1 | 5/2010 | Lehr et al. | |
| 2010/0140716 A1 | 6/2010 | Lin et al. | |
| 2010/0159658 A1 | 6/2010 | Ouyang et al. | |
| 2010/0193876 A1 | 8/2010 | Ramani et al. | |
| 2010/0197089 A1 | 8/2010 | Kim et al. | |
| 2010/0210084 A1* | 8/2010 | Yang ................ H01L 29/66636 438/285 |
| 2010/0213553 A1 | 8/2010 | Hargrove et al. | |
| 2010/0252888 A1* | 10/2010 | Iwamoto ......... H01L 21/823842 257/369 |
| 2010/0301427 A1 | 12/2010 | Lenski et al. | |
| 2011/0049629 A1 | 3/2011 | Ishikawa et al. | |
| 2011/0175147 A1 | 7/2011 | Adusumilli et al. | |
| 2011/0198699 A1 | 8/2011 | Hung et al. | |
| 2011/0227163 A1 | 9/2011 | Wang et al. | |
| 2011/0254092 A1 | 10/2011 | Yang et al. | |
| 2011/0260257 A1 | 10/2011 | Jagannathan et al. | |
| 2011/0278676 A1 | 11/2011 | Cheng et al. | |
| 2011/0291196 A1 | 12/2011 | Wei et al. | |
| 2012/0007145 A1 | 1/2012 | Chen et al. | |
| 2012/0012939 A1 | 1/2012 | Wenwu et al. | |
| 2012/0052641 A1 | 3/2012 | Lee et al. | |
| 2012/0068268 A1 | 3/2012 | Hsiao et al. | |
| 2012/0104508 A1 | 5/2012 | Zhu et al. | |
| 2012/0104509 A1* | 5/2012 | Matsumoto ..... H01L 21/823814 257/369 |
| 2012/0119204 A1 | 5/2012 | Wong et al. | |
| 2012/0139061 A1 | 6/2012 | Ramachandran et al. | |
| 2012/0171820 A1 | 7/2012 | Waite et al. | |
| 2012/0187482 A1* | 7/2012 | Adam ............ H01L 21/823807 257/336 |
| 2012/0193712 A1 | 8/2012 | Bryant et al. | |
| 2012/0211808 A1 | 8/2012 | Wei et al. | |
| 2012/0228680 A1 | 9/2012 | Matsuki | |
| 2012/0248545 A1 | 10/2012 | Yugami | |
| 2012/0256265 A1 | 10/2012 | Fujimoto | |
| 2012/0256276 A1 | 10/2012 | Hwang et al. | |
| 2012/0306026 A1 | 12/2012 | Guo et al. | |
| 2012/0313144 A1 | 12/2012 | Zhang et al. | |
| 2013/0099307 A1 | 4/2013 | Tseng et al. | |
| 2013/0099314 A1 | 4/2013 | Lu et al. | |
| 2013/0102117 A1 | 4/2013 | Hsu | |
| 2013/0105870 A1* | 5/2013 | Tateshita ........... H01L 21/82345 257/292 |
| 2013/0105907 A1 | 5/2013 | Yin et al. | |
| 2013/0154012 A1 | 6/2013 | Fu et al. | |
| 2013/0168744 A1 | 7/2013 | Hsu et al. | |
| 2013/0217220 A1* | 8/2013 | Jagannathan ... H01L 21/823821 438/592 |
| 2013/0228830 A1 | 9/2013 | Lee et al. | |
| 2013/0260549 A1 | 10/2013 | Jagannathan et al. | |
| 2013/0285155 A1 | 10/2013 | Glass et al. | |
| 2014/0001575 A1 | 1/2014 | Adams et al. | |
| 2014/0054717 A1 | 2/2014 | Edge et al. | |
| 2014/0073119 A1 | 3/2014 | Bedell et al. | |
| 2014/0084245 A1 | 3/2014 | Zhang | |
| 2014/0099784 A1 | 4/2014 | Kim et al. | |
| 2014/0110767 A1 | 4/2014 | Anderson et al. | |
| 2014/0120711 A1 | 5/2014 | Tsai et al. | |
| 2014/0131808 A1 | 5/2014 | Ando et al. | |
| 2014/0151763 A1 | 6/2014 | Hung et al. | |
| 2014/0154848 A1 | 6/2014 | Lin et al. | |
| 2014/0191335 A1 | 7/2014 | Yin et al. | |
| 2014/0246695 A1 | 9/2014 | Chen et al. | |
| 2014/0252423 A1 | 9/2014 | Tsao et al. | |
| 2014/0332895 A1 | 11/2014 | Kobayashi et al. | |
| 2015/0021663 A1 | 1/2015 | Akarvardar et al. | |
| 2015/0041897 A1 | 2/2015 | Basker et al. | |
| 2015/0279970 A1 | 10/2015 | Zhang | |
| 2015/0371989 A1 | 12/2015 | Kim et al. | |
| 2016/0099339 A1 | 4/2016 | Zhang et al. | |

OTHER PUBLICATIONS

U.S. Appl. No. 14/986,229, filed Dec. 31, 2015, Methods and Devices for Enhancing Mobility of Charge Carriers.
U.S. Appl. No. 14/231,466, filed Mar. 31, 2014, SOI FinFET Transistor With Strained Channel.
Crothers, "How Intel's 3D tech redefines the transistor (FAQ)," URL=http://www.cnet.com/news/how-intels-3d-tech-redefines-the-transistor-faq/, download date Dec. 11, 2014, 4 pages.

(56) References Cited

OTHER PUBLICATIONS

Auth et al., "45nm High-k+Metal Gate Strain-Enhanced Transistors," *Intel Technology Journal* 12(2):77-86, 2008.

Martyniuk et al., "Stress in low-temperature plasma enhanced chemical vapour doposited silicon nitride thin films," *Smart Mater. Struct.* 15:S29-S38, 2006.

Mohta et al., "Mobility Enhancement: The Next Vector to Extend Moore's Law," *IEEE Cirucuits & Devices Magazine*, pp. 18-23, 2005.

Ootsuka et al., "Hole Mobility Enhancement Caused by Gate-Induced Vertical Strain in Gate-First Full-Metal High-k P-Channel Field Effect Transistors Using Ion-Beam W," *Japanese Journal of Applied Physics* 48(056502), 2009, 6 pages.

Packan et al., "High Performance Hi-K + Metal Gate Strain Enhanced Transistors on (110) Silicon," *IEEE International Electron Devices Meeting*, Dec. 2008, 4 pages.

Solid State Technology, "Analyzing strained-silicon options for stress-engineering transistors," retrieved on Mar. 4, 2013, from http://www.electroiq.com/articles/sst/print/volume-47/issue-7/features/software/analyzing-strained-options-for-stress-engineering-transistors.html, 6 pages.

"Strain engineering," Wikipedia, retrieved on Mar. 4, 2013, from http://en.wikipedia.org/wiki/Strain_engineering, 2 pages.

Yang et al., "Dual Stress Liner for High Performance sub-45nm Gate Length SOI CMOS Manufacturing," *IEDM Technical Digest*, pp. 1075-1077, 2004.

\* cited by examiner

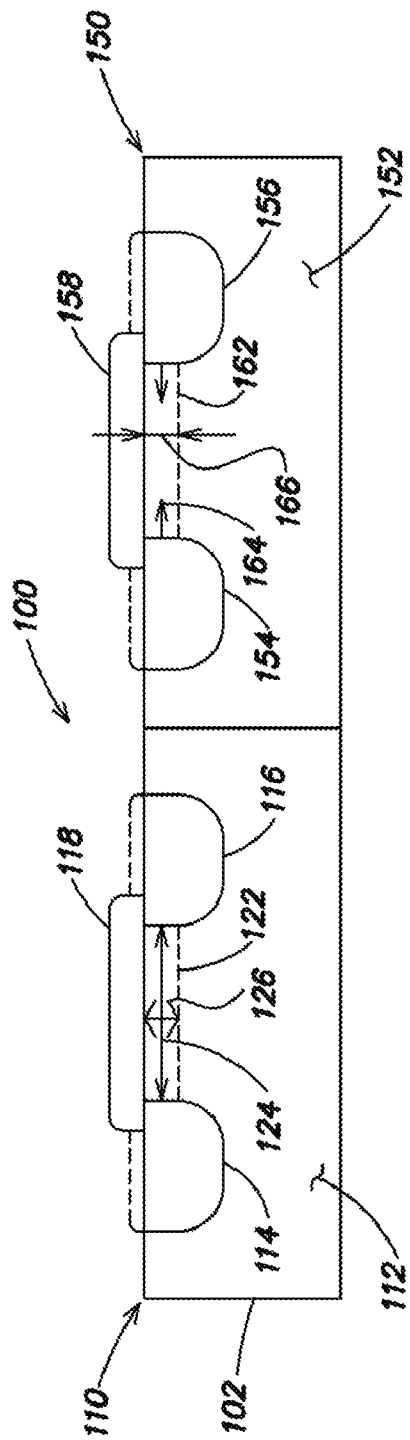
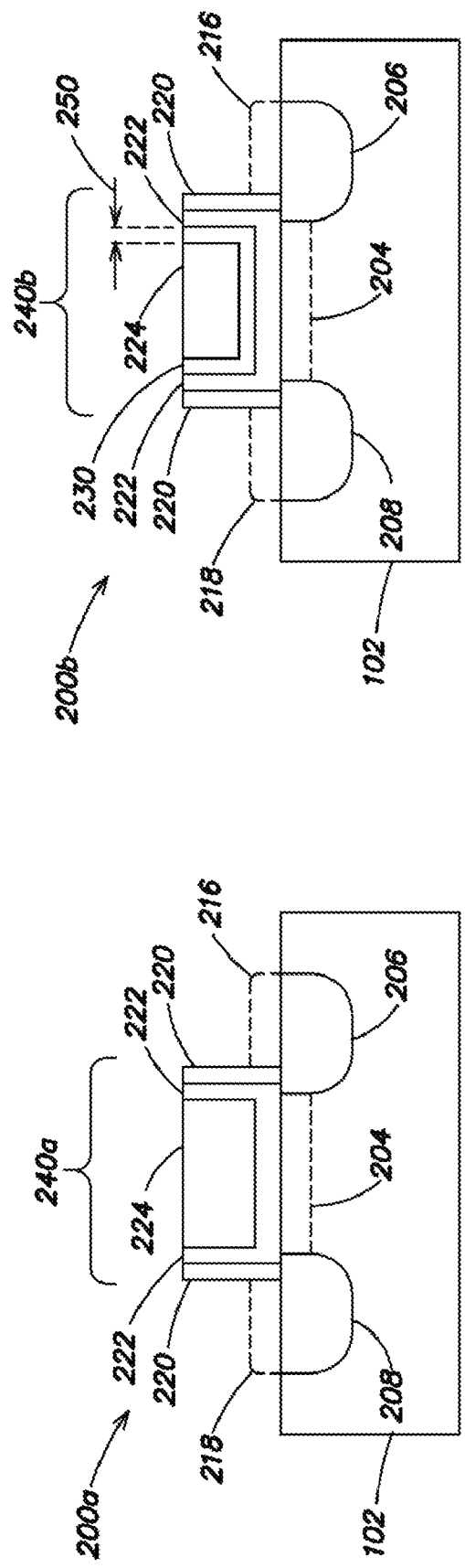
FIG. 1
FIG. 2A
FIG. 2B

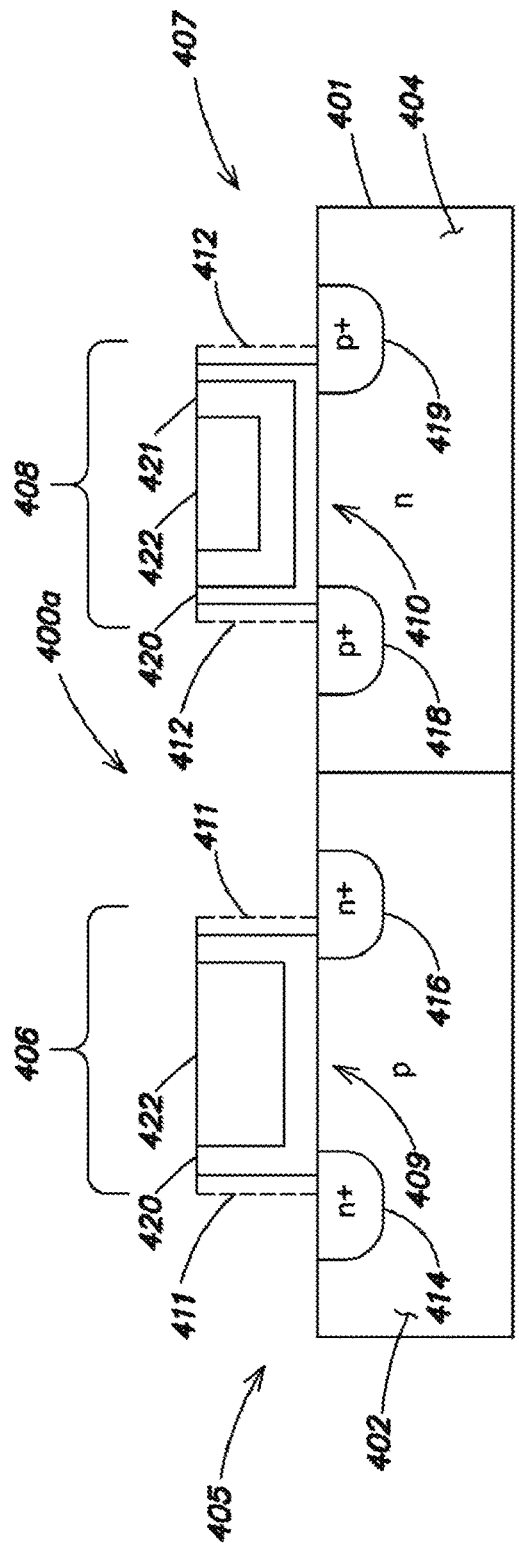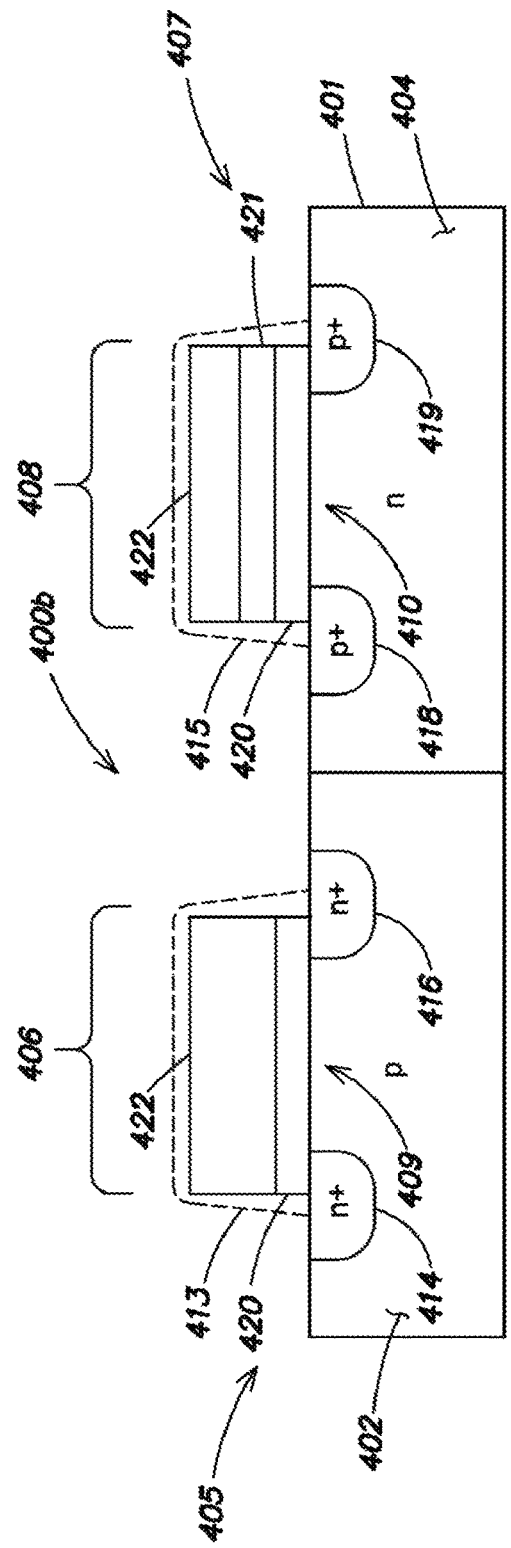

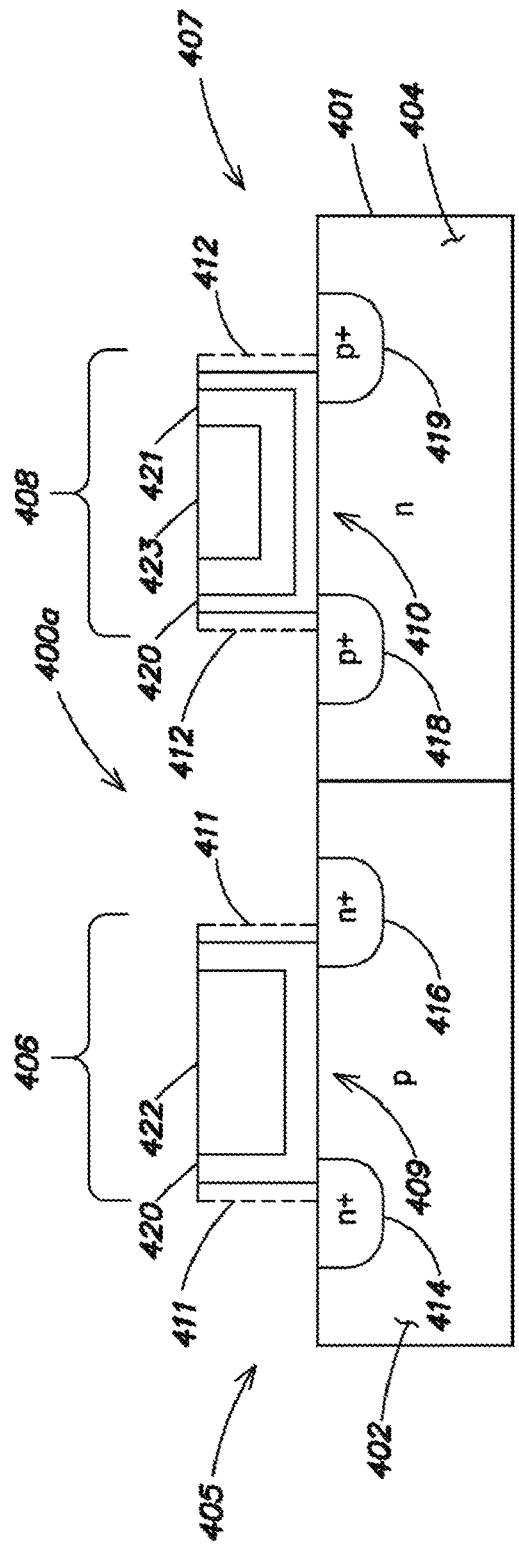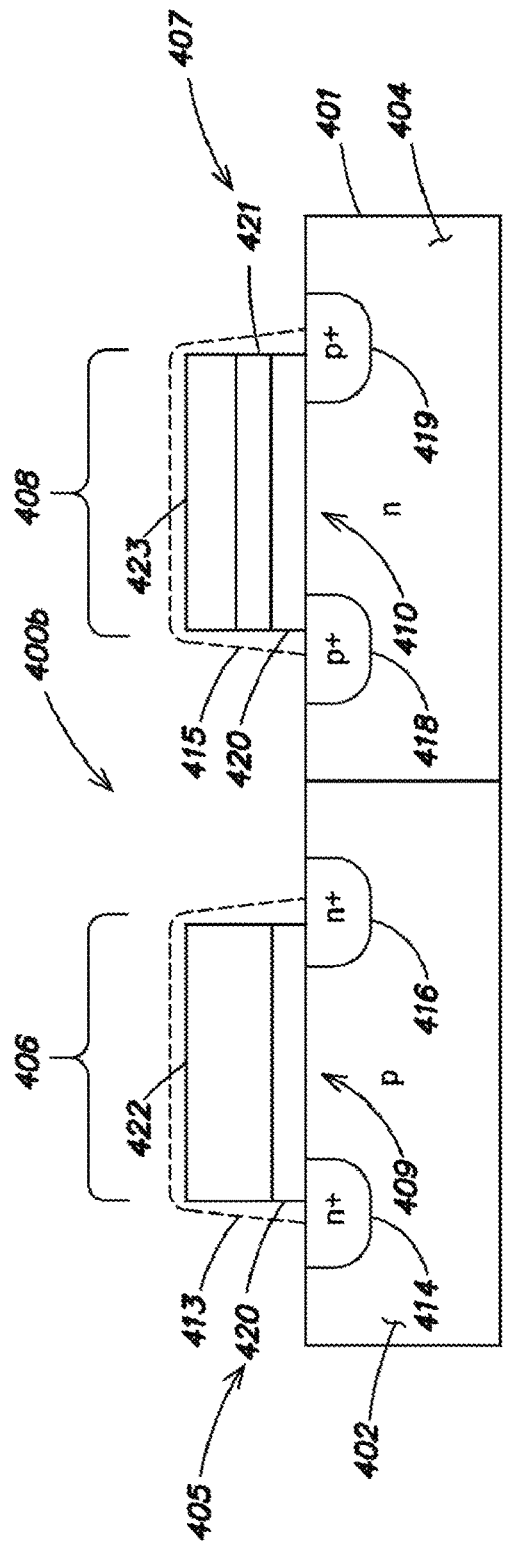

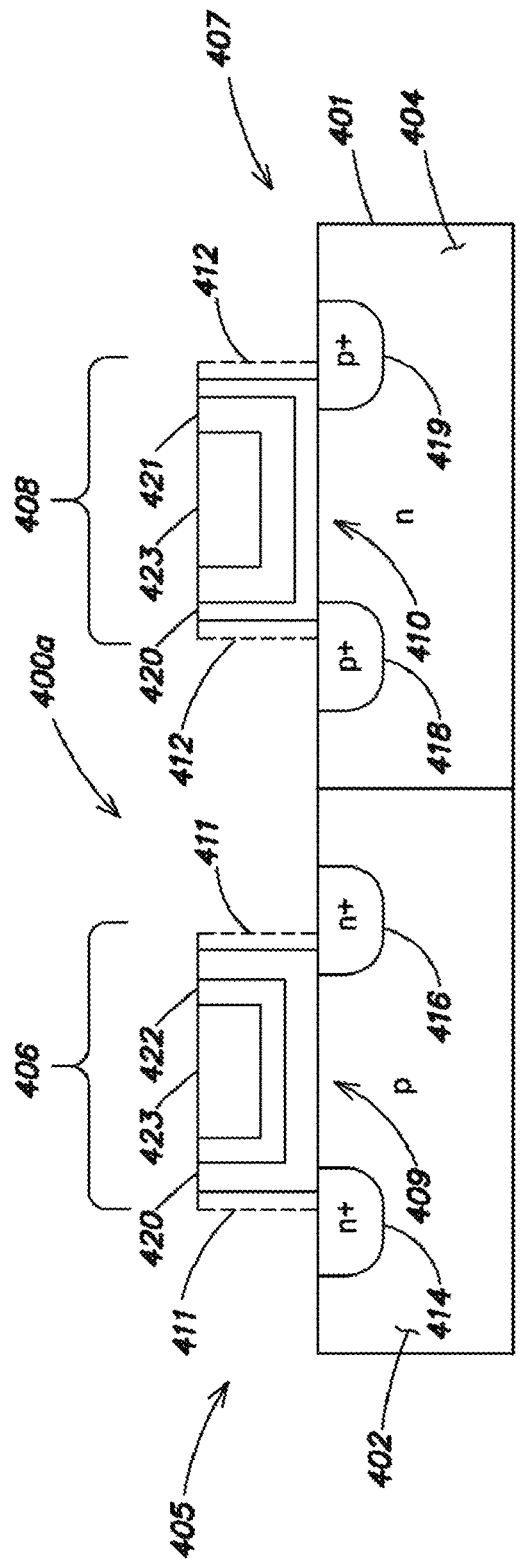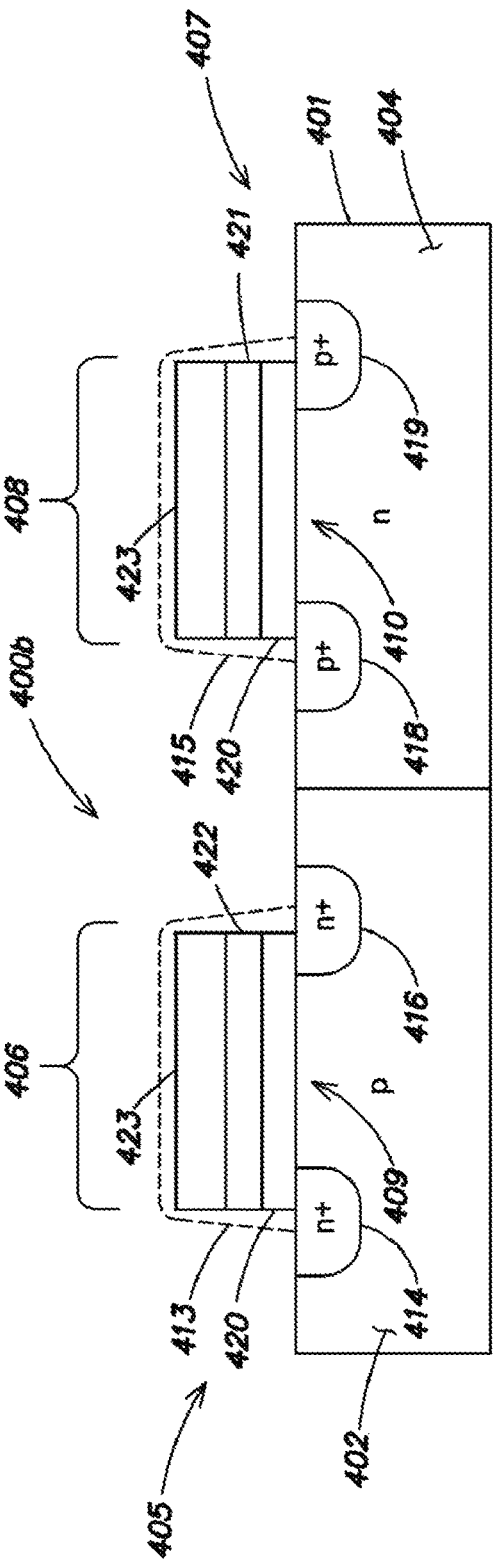

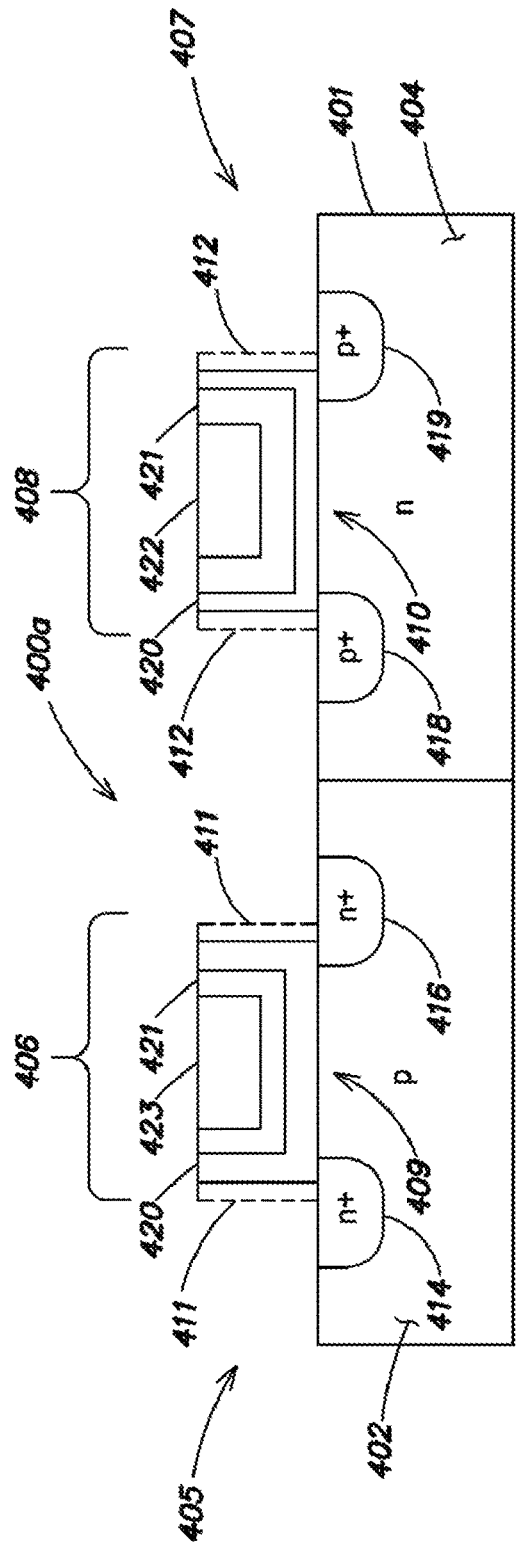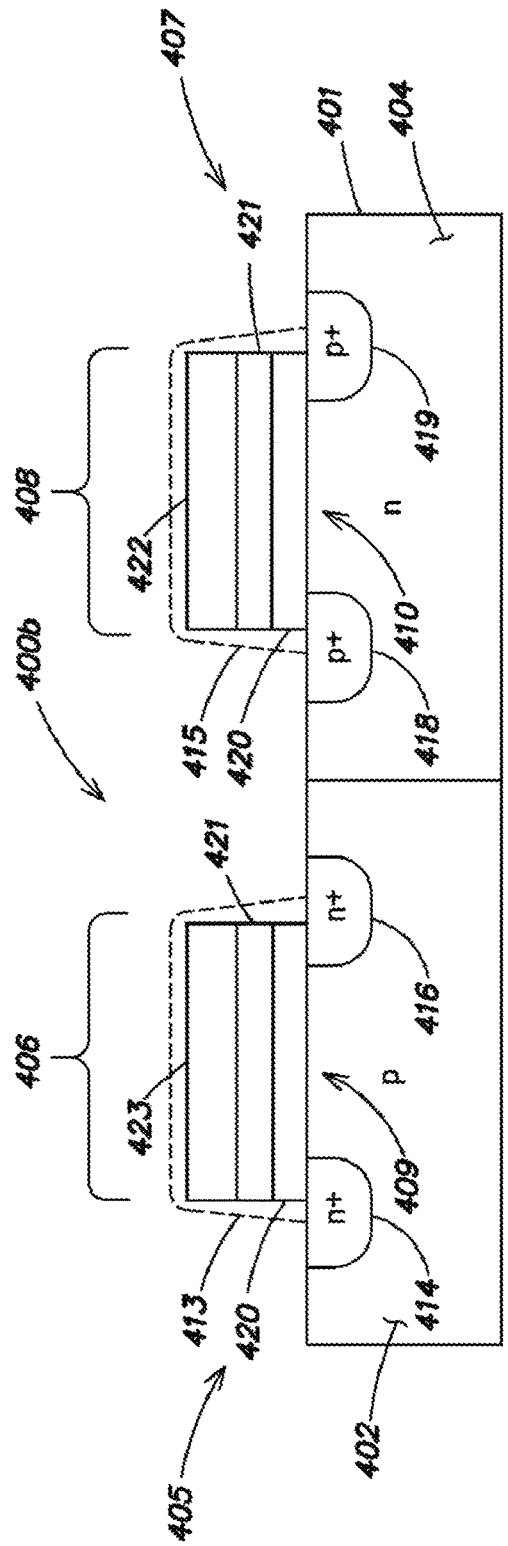

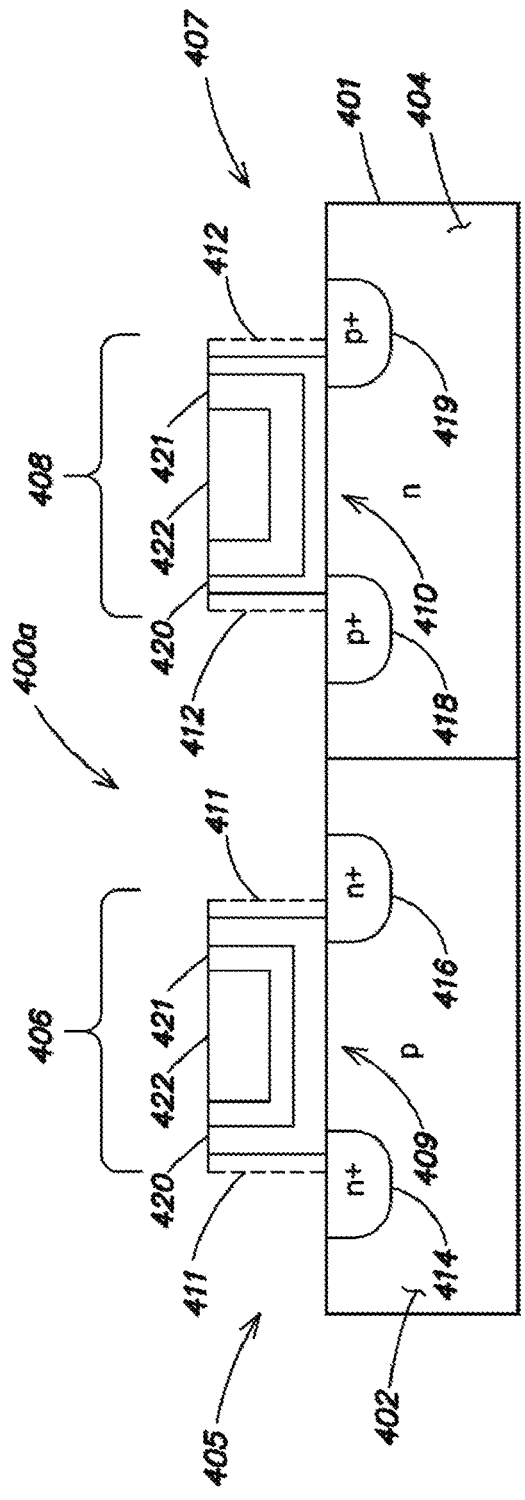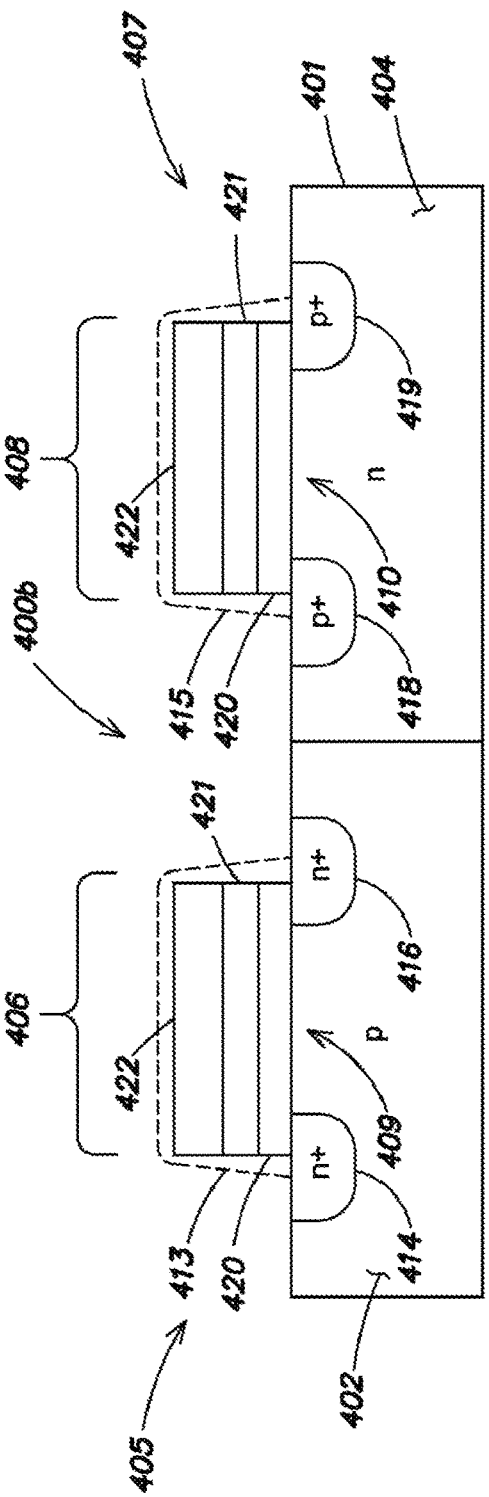

US 10,553,497 B2

METHODS AND DEVICES FOR ENHANCING MOBILITY OF CHARGE CARRIERS

CROSS REFERENCE TO RELATED APPLICATION

The present application is a divisional of U.S. patent application Ser. No. 13/856,325, filed Apr. 3, 2013, which is incorporated herein by reference in its entirety.

BACKGROUND

Technical Field

The present disclosure relates to methods and devices for enhancing mobility of charge carriers. Some embodiments of the present disclosure relate particularly to integrated circuits with metal-gate semiconductor devices, in which the channel of one type of metal-gate semiconductor device is compressively strained, and the channel of another type of metal-gate semiconductor device is tensilely strained.

Description of the Related Art

Straining the channel of a semiconductor device may improve the device's performance. Some semiconductor devices, such as transistors, have a channel through which charge carriers move when the semiconductor device is activated. The mobility of charge carriers in the device's channel may be an important factor in determining the device's performance. For example, the switching speed and/or drive strength of a semiconductor device may depend on the mobility of charge carriers in the device's channel. Straining the channel of a semiconductor device may enhance the mobility of charge carriers in the channel (relative to the mobility of charge carriers in an unstrained channel), thereby improving the device's performance (e.g., switching speed or drive strength). For example, the mobility of holes (charge carriers for some types of semiconductor devices, such as n-channel MOSFETs) may be enhanced in a tensilely strained channel. A tensilely strained channel may be deformed (e.g., stretched) by the application of a tensile stress. As another example, the mobility of electrons (charge carriers for some types of semiconductor devices, such as p-channel MOSFETs) may be enhanced in a compressively strained channel. A compressively strained channel may be deformed (e.g., compressed) by the application of compressive stress.

Techniques for fabricating semiconductor devices with strained channels are known. Strain may be induced in a silicon substrate by growing the silicon substrate on top of another crystalline substrate with a different lattice. For example, tensile strain may be induced by growing a silicon substrate on top of silicon-germanium (SiGe), which has a larger lattice than silicon and therefore applies tensile stress to the silicon lattice. As another example, compressive strain may be induced by growing a silicon substrate on top of a silicon carbide (e.g., SiCP), which has a smaller lattice than silicon and therefore applies compressive stress to the silicon lattice. However, with this technique, it may be difficult to induce compressive strain in some portions of the silicon (e.g., for PFET channels) and to induce tensile strain in other portions of the silicon (e.g., for NFET channels).

A strained channel may be formed by implanting materials into a silicon substrate to change the lattice in regions of the substrate (e.g., in channel regions). For example, implantation may be used to form a tensilely strained silicon carbide (e.g., SiCP) channel region, because the larger lattice of the silicon substrate applies tensile stress to the smaller lattice of the silicon carbide channel. As another example, implantation may be used to form a compressively strained silicon-germanium (e.g., SiGe) channel region, because the smaller lattice of the silicon substrate applies compressive stress to the larger lattice of the silicon-germanium channel. However, this technique may require very low temperatures during the fabrication process (e.g., −60 C), and may exacerbate short-channel effects (SCE).

A strained channel may also be formed by forming "liners" or "capping layers" on the gates of semiconductor devices. For example, a silicon nitride liner formed on the gate of a PFET may apply compressive stress to the PFET's channel, and a different silicon nitride liner formed on the gate of an NFET may apply tensile stress to the NFET's channel. However, this technique may require additional process steps, including chemical-mechanical polishing (CMP).

When the gate of a semiconductor device includes a metallic material, the device's "metal gate" may apply stress to the channel, thereby forming a strained channel. Some metal gates may include a metallic portion and a work-function layer. The work-function layer may modulate the gate's work function, thereby giving a process engineer control over the device's band gap, threshold voltage, etc.

BRIEF SUMMARY

According to an embodiment, there is provided an integrated circuit including a first semiconductor device of a first type and a second semiconductor device of a second type. The first semiconductor device of the first type including a first gate and a first strained channel. The first gate includes a first metallic portion. The first strained channel is strained in a first manner. The second semiconductor device of the second type includes a second gate and a second strained channel. The second gate includes a second metallic material. The second strained channel is strained in a second manner. The first and second gates collectively include three or fewer metallic materials.

According to another embodiment, there is provided an integrated circuit including a first semiconductor device of a first type and a second semiconductor device of a second type. The first semiconductor device of the first type including a first gate and a first strained channel. The first gate includes a first metallic portion. The first strained channel is strained in a first manner. The second semiconductor device of the second type includes a second gate and a second strained channel. The second gate includes a second metallic material. The second strained channel is strained in a second manner. A same metallic material is included in the first gate of the first semiconductor device and in the second gate of the second semiconductor device.

According to another embodiment, there is provided an integrated circuit including a first semiconductor device of a first type and a second semiconductor device of a second type. The first semiconductor device of the first type including a first gate and a first channel. The first gate includes a first metallic material. The second semiconductor device of the second type including a second gate and a second channel. The second gate includes a second metallic material. The integrated circuit further includes means for using the first and second gates to increase mobility of charge carriers in channels of the first semiconductor device and the second semiconductor device, respectively. The first and second gates collectively include three or fewer metallic materials.

According to another embodiment, there is provided an integrated circuit including a first semiconductor device of a first type and a second semiconductor device of a second type. The first semiconductor device of the first type including a first gate and a first channel. The first gate includes a first metallic material. The second semiconductor device of the second type including a second gate and a second channel. The second gate includes a second metallic material. The integrated circuit further includes means for using the first and second gates to increase mobility of charge carriers in channels of the first semiconductor device and the second semiconductor device, respectively. A same metallic material is included in the first gate of the first semiconductor device and in the second gate of the second semiconductor device.

According to another embodiment, there is provided a method of forming semiconductor devices on an integrated circuit. A first of the semiconductor devices has a first gate and a first strained channel, a second of the semiconductor devices has a second gate and a second strained channel. The method includes depositing a first metallic layer in first and second regions of the integrated circuit corresponding to the first and second gates, respectively. The method further includes depositing a second metallic layer in the first and second regions of the integrated circuit corresponding to the first and second gates, respectively. The first and second gates collectively include three or fewer metallic materials. The first strained channel is strained in a first manner, and the second strained channel is strained in a second manner.

According to another embodiment, there is provided a method of forming semiconductor devices on an integrated circuit. A first of the semiconductor devices has a first gate and a first strained channel, a second of the semiconductor devices has a second gate and a second strained channel. The method includes depositing a first metallic layer in first and second regions of the integrated circuit corresponding to the first and second gates, respectively. The method further includes depositing a second metallic layer in the first and second regions of the integrated circuit corresponding to the first and second gates, respectively. A same metallic material is included in the first gate of the first semiconductor device and in the second gate of the second semiconductor device. The first strained channel is strained in a first manner, and the second strained channel is strained in a second manner.

BRIEF DESCRIPTION OF THE SEVERAL VIEWS OF THE DRAWINGS

For an understanding of some embodiments, reference will now be made by way of example only to the accompanying figures in which:

FIG. 1 shows an integrated circuit, according to some embodiments;

FIG. 2A shows a transistor 200a with a gate 240a that includes one or more metallic materials, according to some embodiments;

FIG. 2B shows a transistor 200b with a gate 240b that includes one or more metallic materials, according to some embodiments;

FIG. 5A shows a metal-gate PFET and a metal-gate NFET formed on an integrated circuit 400a as part of a gate-last process using steps 304, 306, 308, 312, 314, and 333 of the method illustrated in FIGS. 3A and 3B, according to some embodiments;

FIG. 5B shows a metal-gate PFET and a metal-gate NFET formed on an integrated circuit 400b as part of a gate-first process using steps 306, 308, 312, 314, 333, and 336 of the method illustrated in FIGS. 3A and 3B, according to some embodiments;

FIG. 6A shows a metal-gate PFET and a metal-gate NFET formed on an integrated circuit 400a as part of a gate-last fabrication process using steps 304, 306, 308, 312, 314, 318, 320, 323, and 333 of the method illustrated in FIGS. 3A and 3B, according to some embodiments;

FIG. 6B shows a metal-gate PFET and a metal-gate NFET formed on an integrated circuit 400b as part of a gate-first process using steps 306, 308, 312, 314, 318, 320, 323, 333, and 336 of the method illustrated in FIGS. 3A and 3B, according to some embodiments;

FIG. 7A shows a metal-gate PFET and a metal-gate NFET formed on an integrated circuit 400a as part of a gate-last fabrication process using steps 304, 306, 308, 312, 314, 318, 320, and 333 of the method illustrated in FIGS. 3A and 3B, according to some embodiments;

FIG. 7B shows a metal-gate PFET and a metal-gate NFET formed on an integrated circuit 400b as part of a gate-first process using steps 306, 308, 312, 314, 318, 320, 333, and 336 of the method illustrated in FIGS. 3A and 3B, according to some embodiments;

FIG. 8A shows a metal-gate PFET and a metal-gate NFET formed on an integrated circuit 400a as part of a gate-last fabrication process using steps 304, 306, 308, 324, 328, 330, 332, and 333 of the method illustrated in FIGS. 3A and 3B, according to some embodiments;

FIG. 8B shows a metal-gate PFET and a metal-gate NFET formed on an integrated circuit 400b as part of a gate-first process using steps 306, 308, 324, 328, 330, 332, 333, and 336 of the method illustrated in FIGS. 3A and 3B, according to some embodiments;

FIG. 9A shows a metal-gate PFET and a metal-gate NFET formed on an integrated circuit 400a as part of a gate-last fabrication process using steps 304, 306, 308, 324, and 333 of the method illustrated in FIGS. 3A and 3B, according to some embodiments; and FIG. 9B shows a metal-gate PFET and a metal-gate NFET formed on an integrated circuit 400b as part of a gate-first process using steps 306, 308, 324, 333, and 336 of the method illustrated in FIGS. 3A and 3B, according to some embodiments.

Figure 2D:
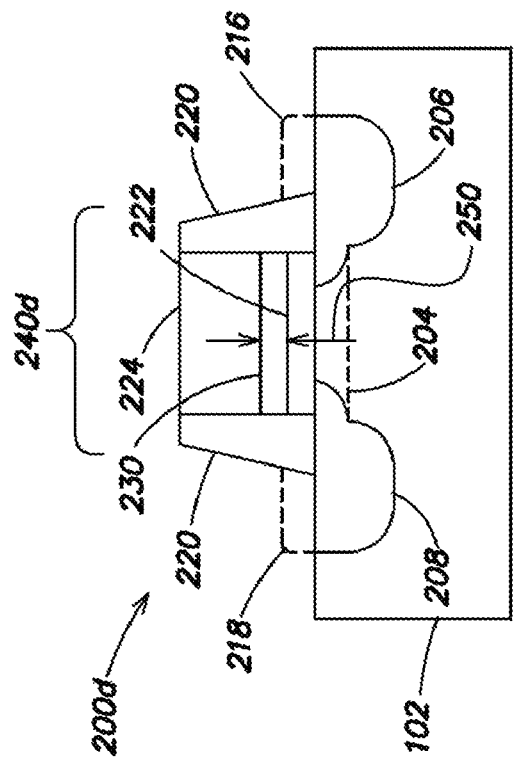
FIG. 2D shows a transistor 200d with a gate 240d that includes one or more metallic materials, according to some embodiments.

For clarity, the same elements have been designated with the same reference numerals in the different drawings and, further, as usual in the representation of integrated circuits, the various drawings are not to scale. For clarity, only those steps and elements which are useful to the understanding of the described embodiments have been shown and will be discussed.

DETAILED DESCRIPTION

Some conventional techniques for fabricating metal-gate semiconductor devices may produce integrated circuits containing tensilely strained channels or compressively strained channels, but not both. Some conventional techniques for fabricating metal-gate semiconductor devices may use a large number of metals and/or processing steps. Applicant has recognized and appreciated the need for a method of fabricating metal-gate semiconductor devices using a small number of processing steps and/or metallic materials, such that the resulting integrated circuit includes both tensilely strained channels and compressively strained channels.

According to an embodiment, an integrated circuit may include semiconductor devices of first and second types. For example, the integrated circuit may include NFETs and PFETs. A semiconductor device of the first type (e.g., an NFET) may include a gate and a tensilely strained channel. A semiconductor device of the second type (e.g., a PFET) may include a gate and a tensilely strained channel. The gates may include one or more metallic materials.

In some embodiments, the gates of the two types of semiconductor devices may collectively include three or fewer metallic materials. In some embodiments, a same metallic material may be included in the gates of the two types of semiconductor devices.

In some embodiments, the gate of the first type of semiconductor device (e.g., NFET) may apply tensile stress to the channel of the first type of semiconductor device. In some embodiments, the gate of the second type of semiconductor device (e.g., PFET) may apply compressive stress to the channel of the second type of semiconductor device.

In some embodiments, the gates of either or both types of semiconductor devices may include work-function layers. In some embodiments, properties of a device's work-function layer (e.g., the thickness of the work-function layer, the material(s) included in the work-function layer, or the power provided to a cathode used for cathodic arc deposition of the work-function layer) may modulate the stress applied to the device's channel by the device's metal gate. For example, properties of the work-function may determine whether the stress applied to the channel by the gate is compressive or tensile. As another example, properties of the work-function layer may determine the magnitude of the stress applied to the channel by the gate.

The features described above, as well as additional features, are described further below. These features may be used individually, all together, or in any combination, as the technology is not limited in this respect.

FIG. 1 shows an integrated circuit, according to some embodiments. Integrated circuit 100 of FIG. 1 includes two transistors 110 and 150. In some embodiments, transistors 110 and 150 may be MOSFETs (metal-oxide semiconductor field effect transistors). In some embodiments, transistor 110 may be an n-channel MOSFET (also referred to as an "NMOS FET" or "NFET"). In some embodiments, transistor 150 may be a p-channel MOSFET (also referred to as a "PMOS FET" or "PFET").

In the embodiment of FIG. 1, the bodies of transistors 110 and 150 are formed in regions 112 and 152, respectively, of substrate 102. In some embodiments, substrate 102 may include silicon, silicon germanium, silicon carbide, and/or other material(s) known to one of ordinary skill in the art or otherwise suitable for fabricating semiconductor devices. In some embodiments substrate 102 may be a p-substrate, region 112 may be a portion of the p-substrate, and region 152 may be an n-well formed in the p-substrate. In some embodiments, substrate 102 may be a n-substrate, region 112 may be a p-well formed in the n-substrate, and region 152 may be a portion of the n-substrate. In some embodiments, substrate 102 may be a bulk substrate, a silicon-on-insulator (SOI) substrate, a strained-silicon-direct-on-insulator (SSDOI) substrate, a strained heterostructure-on-insulator (HOI) substrate, or any other type of substrate known to one of ordinary skill in the art or otherwise suitable for fabricating semiconductor devices.

In some embodiments, transistors 110 and 150 may be fully or partially isolated from each other using any technique known to one of ordinary skill in the art or otherwise suitable for isolating semiconductor devices, including but not limited to shallow trench isolation (STI).

In the embodiment of FIG. 1, transistor 110 includes a gate 118, a source diffusion region (also referred to as a "source" or "source diffusion") 114, a drain diffusion region (also referred to as a "drain" or "drain diffusion" 116), a channel 122, and a body. In some embodiments, the source and drain diffusions may be doped (e.g., heavily-doped) p-type diffusion regions. In some embodiments, source 114 and or drain 116 may be raised. A raised source or drain may be formed using any technique known to one of ordinary skill in the art or otherwise suitable for forming a raised source or drain, including but not limited to etching a portion of substrate 102 and/or siliciding a portion of a diffusion region. As described above, the body of transistor 110 may be formed in region 112 of substrate 102, which may be an n-doped silicon region. Channel 122 of transistor 110 may occupy portions of substrate 102 between source 114 and drain 116 under gate 118. Gate 118 may include, for example, an insulating layer formed on substrate 102 and a material portion formed on the insulating layer. In some embodiments, the material portion may be formed, for example, from polysilicon, one or more metallic materials, and/or any materials known to one of ordinary skill in the art or otherwise suitable for forming a gate.

In some embodiments, gate 118 may include or be partially or fully covered by a spacer layer, a liner, a capping layer, and/or any other type of 'gate-covering layer.' A gate-covering layer may be formed near the gate of a transistor (e.g., over the gate and/or adjacent to the sidewalls of the gate) by means known to one of ordinary skill in the art or otherwise suitable for forming a gate-covering layer, including but not limited to deposition and photolithographic patterning of a gate-covering material. In some embodiments, a gate-covering layer may include a nitride and/or an oxide, such as silicon nitride (SiN) or silicon oxide (SiO). In some embodiments, a gate-covering layer may insulate the gate from other portions of the integrated circuit, facilitate a self-aligning transistor fabrication process, apply stress to the transistor channel, etc.

In the embodiment of FIG. 1, transistor 150 includes a gate 158, a source diffusion region 154, a drain diffusion region 156, a channel 162, and a body. In some embodiments, the source and drain diffusions may be doped (e.g., heavily doped) n-type diffusion regions. As described above, the body of transistor 150 may be formed in region 152 of substrate 102, which may be a p-doped silicon region. Channel 162 of transistor 150 may occupy portions of substrate 102 between source 154 and drain 156 under gate 158. Gate 158 may include, for example, an insulating layer formed on substrate 102 and a material portion formed on the insulating layer. In some embodiments, the material portion may be formed, for example, from polysilicon, one or more metallic materials, and/or any materials known to one of ordinary skill in the art or otherwise suitable for forming a gate. In some embodiments, gate 158 may include or be partially or fully covered by gate-covering layer.

In the embodiment of FIG. 1, channels 122 and 162 are strained. In some embodiments, channels 122 and 162 may be strained in different ways. For example, channel 122 may be tensilely strained, and channel 162 may be compressively strained. In some embodiments, channel 122 may be tensilely strained in a horizontal direction 124 (e.g., stretched in a direction roughly parallel to a surface of the substrate, such as a direction extending between source 114 and drain 116), and/or tensilely strained in a vertical direction 126 (e.g., stretched in a direction roughly orthogonal to a surface of the substrate, such as a direction extending between gate 118 and substrate 102). Likewise, channel 162 may be compressively strained in a horizontal direction 164 (e.g., compressed in a direction roughly parallel to a surface of the substrate, such as a direction extending between source 154 and drain 156), and/or compressively strained in a vertical direction 166 (e.g., compressed in a direction roughly orthogonal to a surface of the substrate, such as a direction extending between gate 158 and substrate 102).

Although MOSFETS are shown in the example of FIG. 1, embodiments are not limited in this regard. Embodiments may include (or be used to fabricate) any semiconductor devices known to one of ordinary skill in the art or otherwise suitable for operating with strained channels, including but not limited to diodes, other types of transistors, etc.

FIG. 2A shows a transistor 200*a* with a gate 240*a* that includes one or more metallic materials, according to some embodiments. A transistor with a gate that includes one or more metallic materials may be referred to as a "metal-gate transistor." In some embodiments, metal-gate transistor 200*a* may be formed using a gate-last fabrication process, such as a replacement-gate fabrication process. In some embodiments, metal-gate transistor 200*a* may be a MOSFET with a gate 240*a*, a source diffusion region 208, a drain diffusion region 206, a channel 204, and a body. The body of metal-gate transistor 200*a* may be formed in a region of substrate 102. The source and drain diffusion regions may be doped (e.g., heavily doped). The doping types of diffusion regions 206 and 208 and the body region may be opposite doping types. In some embodiments, channel 204 may extend between the source and drain regions under gate 240*a*. In the embodiment of FIG. 2A, source 208 and drain 206 are raised to form raised source 218 and raised drain 216. However, embodiments are not limited in this regard. In some embodiments, metal-gate transistor 200*a* may include a source that is not raised and/or drain that is not raised.

In the embodiment of FIG. 2A, gate 240*a* of metal-gate transistor 200*a* includes a metallic portion 224. Metallic portion 224 may include, for example, aluminum (AL), tungsten (W), copper (Cu), and/or any other metallic material known to one of ordinary skill in the art or otherwise suitable for functioning as a metallic portion of a gate of a metal-gate transistor.

In the embodiment of FIG. 2A, gate 240*a* of metal-gate transistor 200*a* includes a dielectric layer 222. In some embodiments, dielectric layer 222 may insulate metallic portion 224 from other portions of an integrated circuit, including but not limited to source 208 and/or drain 206. In some embodiments, dielectric layer 222 may include a dielectric material, such as polysilicon, a high-k dielectric material (e.g., a material having a dielectric constant higher than the dielectric constant of polysilicon), and/or any other material known to one of ordinary skill in the art or otherwise suitable for insulating portions of a gate of a metal-gate transistor. For example, dielectric layer 222 may include hafnium oxide ($HfO_2$). In some embodiments, portions of dielectric layer 222 may be formed over substrate 102 and under metallic portion 224. In some embodiments portions of dielectric layer 222 may be formed vertically along the sidewalls of gate 240*a*.

In the embodiment of FIG. 2A, channel 204 is strained. Channel 204 may be strained horizontally and/or vertically. In some embodiments (e.g., in embodiments where transistor 200*a* is an NFET), channel 204 may be tensilely strained. In some embodiments (e.g., in embodiments where transistor 200*a* is a PFET), channel 204 may be compressively strained.

In some embodiments, gate 240*a* may apply stress to channel 204. The stress applied by gate 240*a* may contribute to the strain in channel 204. For example, in some embodiments, metallic portion 224 may apply stress (e.g., compressive or tensile stress) to channel 204, contributing to the strain (e.g., compressive or tensile strain, respectively) in channel 204. In some embodiments, the magnitude of the stress applied to channel 204 by gate 240*a* may be less than 100 MPa, between 100 and 300 MPa, between 300 and 500 MPa, or greater than 500 MPa. In some embodiments, gate 240*a* of metal-gate transistor 200*a* may include or be fully or partially covered by a gate-covering layer 220.

FIG. 2B shows a transistor 200*b* with a gate 240*b* that includes one or more metallic materials (a "metal-gate transistor"), according to some embodiments. In some embodiments, metal-gate transistor 200*b* may be a MOSFET formed using a gate-last semiconductor fabrication process. Many elements of metal gate transistor 200*b* shown in FIG. 2B have already been described above with reference to FIG. 2A. For brevity, the description of such elements is not repeated here.

In some embodiments, gate 240*b* of metal-gate transistor 200*b* may include, in addition to dielectric layer 222 and metallic portion 224, a work-function layer 230. In some embodiments, work-function layer 230 may be formed between metallic portion 224 and dielectric layer 222. For example, portions of work-function layer 230 may be formed over dielectric layer 222 and under metallic layer 224. As another example, portions of work-function layer 230 may be formed between sidewall portions of metallic portion 224 and dielectric layer 222.

In some embodiments, the magnitude and/or type of stress applied to channel 204 by gate 240*b* may depend on properties of work-function layer 230, including but not limited to the material(s) included in the work-function layer 230, the manner in which the work-function layer 230 is deposited, the thickness 250 of the work-function layer 230, and/or the stress of the work-function layer 230.

Embodiments of work-function layer 230 may include any material known to one of ordinary skill in the art or otherwise suitable for modulating the work-function of metallic portion 224. In some embodiments, work-function layer 230 may be a material that has a band gap between 4.0 and 5.0 electron-volts (e.g., between 4.0 and 4.5 eV in embodiments where transistor 200*b* is an n-channel device, or between 4.5 and 5.0 eV in embodiments where transistor 200*b* is a p-channel device). In some embodiments, work-function layer 230 may include a metal carbide and/or a metal nitride. For example, in some embodiments, work-function layer 230 may include titanium nitride (TiN), titanium carbide (TiC), lanthanum nitride (LaN), lanthanum carbide (LaC), tantalum nitride (TaN), and/or tantalum carbide (TaC). In some embodiments, work-function layer 230 may include TiN or TaN alloyed with an oxygen-scavenging metal, such as TiWN, TiAlN, TiCuN, TaWN, TaAlN, or TaCuN.

In some embodiments, work-function layer 230 may be deposited by a physical vapor deposition (PVD) technique.

For example, work-function layer 230 may be deposited by cathodic arc deposition. In some embodiments, the power supplied to the cathode used for cathodic arc deposition of work-function layer 230 may be less than 3 kW, between 3 kW and 9 kW, between 9 kW and 12 kW, between 12 kW and 19 kW, or greater than 19 kW. Embodiments are not limited to work-function layers deposited by cathodic arc deposition or physical vapor deposition. In some embodiments work-function layer 230 may be formed using any technique known to one of ordinary skill in the art or otherwise suitable for forming a work-function layer.

In some embodiments, work-function layer 230 may include two or more sub-layers. In some embodiments, the sub-layers may include different materials. In some embodiments, the sub-layers may be deposited using different deposition techniques (e.g., using cathodic arc deposition with different amounts of power supplied to the cathode during deposition of the respective sub-layers). In some embodiments, the sub-layers may have different thicknesses.

As described above, in some embodiments, the strain induced in channel 204 may depend on the thickness 250 of work-function layer 230. The thickness 250 of work-function layer 230 may be, for example, less than 100 angstrom (Å), between 100 and 300 Å, between 300 and 500 Å, or greater than 500 Å.

Figure 2C:
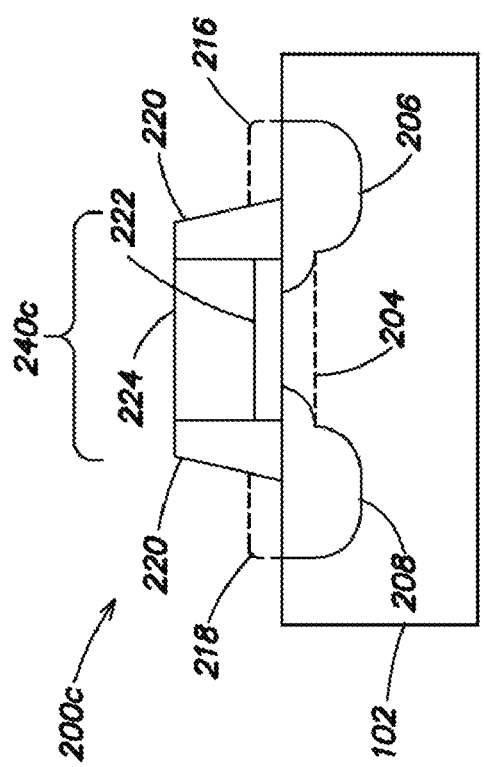
FIG. 2C shows a transistor 200c with a gate 240c that includes one or more metallic materials, according to some embodiments.

FIG. 2C shows a transistor 200c with a gate 240c that includes one or more metallic materials (a "metal-gate transistor"), according to some embodiments. In some embodiments, metal-gate transistor 200c may be a MOSFET formed using a gate-last or gate-first semiconductor fabrication process. Many elements of metal gate transistor 200c shown in FIG. 2C have already been described above with reference to FIG. 2A. For brevity, the description of such elements is not repeated here.

FIG. 2C shows a transistor 200c with a metallic gate 240c, according to some embodiments. In some embodiments, metal-gate transistor 200c may be formed using a gate-first semiconductor fabrication process. Many elements of metal gate transistor 200c shown in FIG. 2C have already been described above with reference to FIGS. 2A and/or 2B. For brevity, the description of such elements is not repeated here.

In the embodiment of FIG. 2C, gate 240c of metal-gate transistor 200c includes a dielectric layer 222 and a metallic portion 224. In some embodiments, gate 240c of metal-gate transistor 200c may include or be fully or partially covered by a gate-covering layer 220. In some embodiments, portions of dielectric layer 222 may be formed over substrate 102 and under metallic portion 224. In some embodiments, portions of dielectric layer 222 may be formed adjacent to the sidewalls of metallic layer 224. In the embodiment of FIG. 2C, channel 204 is strained (e.g., horizontally and/or vertically, and compressively or tensilely). In some embodiments, gate 240c applies stress to channel 204 which contributes to the strain in channel 204.

FIG. 2D shows a transistor 200d with a metallic gate 240d, according to some embodiments. In some embodiments, metal-gate transistor 200d may be formed using a gate-first semiconductor fabrication process. Many elements of metal gate transistor 200d shown in FIG. 2D have already been described above with reference to FIGS. 2A and/or 2B. For brevity, the description of such elements is not repeated here.

In the embodiment of FIG. 2D, gate 240d of metal-gate transistor 200c includes a dielectric layer 222, a work-function layer 230, and a metallic portion 224. In some embodiments, gate 240d of metal-gate transistor 200d may include or be fully or partially covered by a gate-covering layer 220. In some embodiments, portions of dielectric layer 222 may be formed over substrate 102 and under work-function layer 230. In some embodiments, portions of dielectric layer 222 may be formed adjacent to the sidewalls of work-function layer 230 and/or metallic layer 224. In some embodiments, portions of work-function layer 230 may be formed over dielectric layer 222 and under metallic portion 224. In some embodiments, portions of work-function layer 230 may be formed adjacent to the sidewalls of dielectric layer 222 and/or metallic portion 224.

Figure 3A:
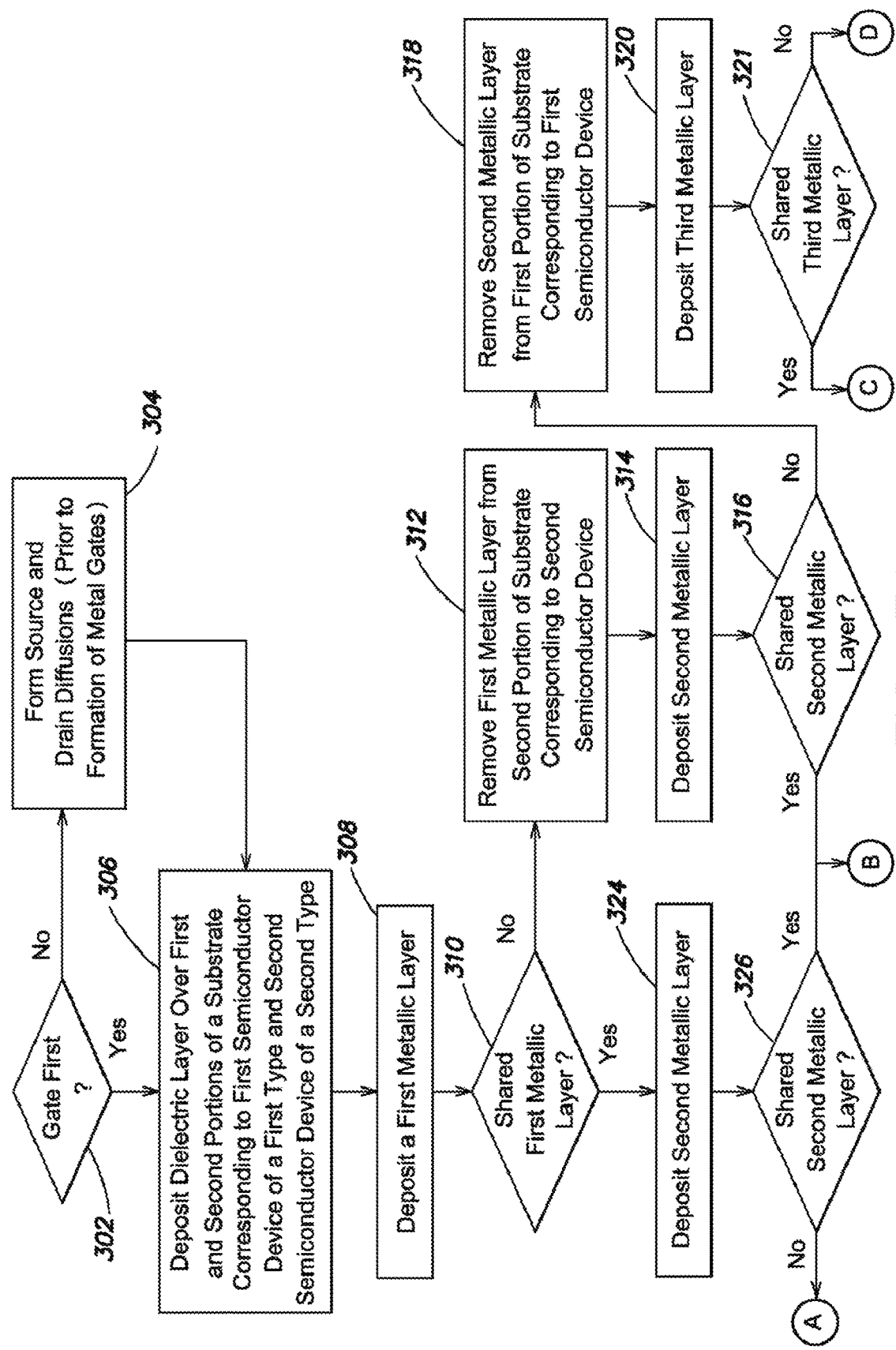
FIGS. 3A and 3B show a flowchart of a method of forming semiconductor devices on an integrated circuit, according to some embodiments.
Figure 3B:
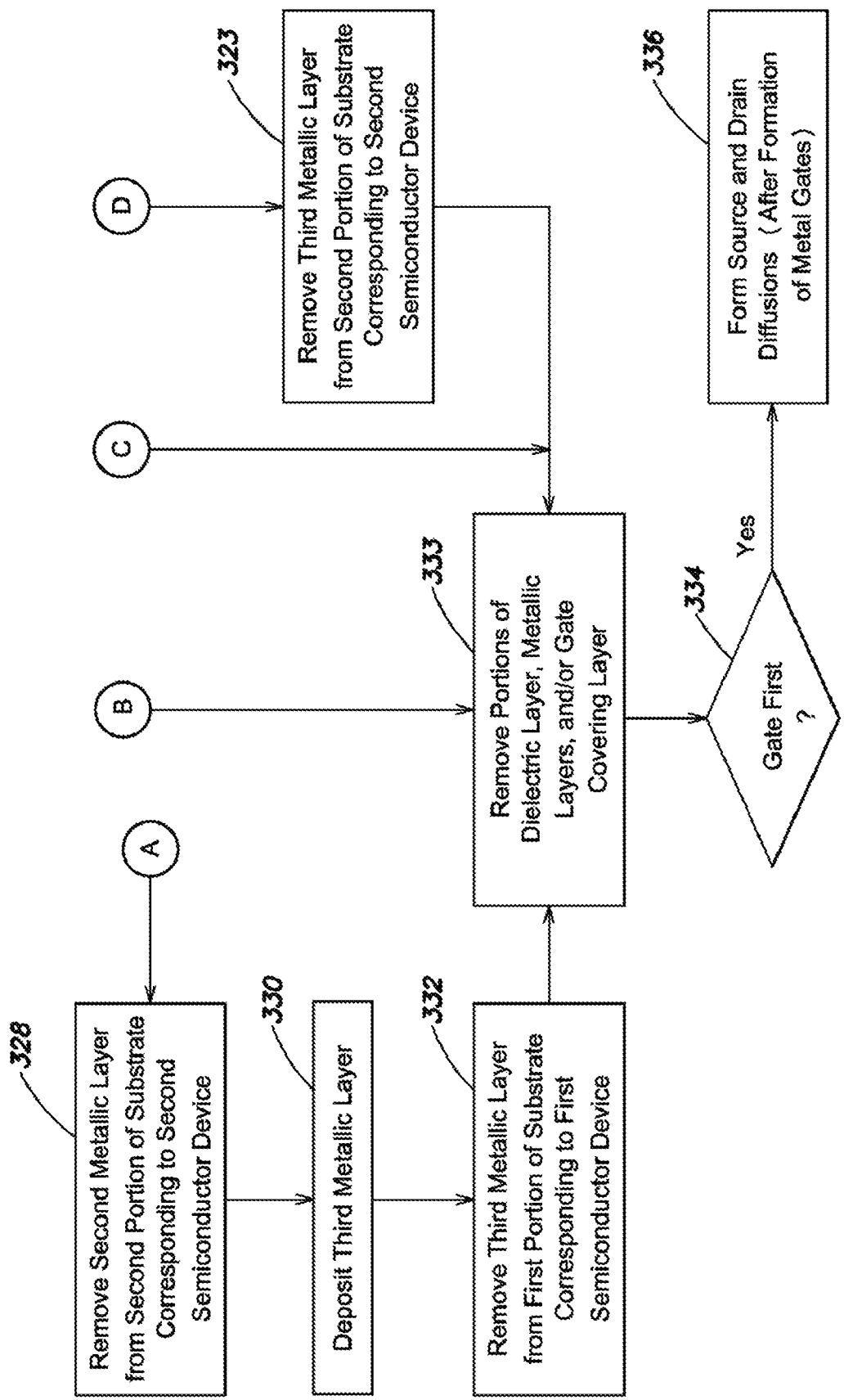

FIGS. 3A and 3B show a flowchart of a method of forming semiconductor devices on an integrated circuit, according to some embodiments. In some embodiments, the method of FIGS. 3A and 3B may be used to form semiconductor devices of first and second types on an integrated circuit. The first type of semiconductor device may have a metallic gate and a channel strained in a first manner. The second type of semiconductor device may have a metallic gate and a channel strained in a second manner. In some embodiments, for example, the method of FIGS. 3A and 3B may be used to form, on an integrated circuit, a metal-gate PFET with a compressively strained channel and a metal-gate NFET with a tensilely strained channel.

Gate-Last Embodiments of the Method of Forming Semiconductor Devices

In some embodiments, the method of FIGS. 3A and 3B may be used to form, on an integrated circuit and as part of a gate-last semiconductor fabrication process, a metal-gate PFET with a compressively strained channel and a metal-gate NFET with a tensilely strained channel. In a gate-last semiconductor fabrication process, a transistor's source and drain are formed before the transistor's gate is formed.

In embodiments of FIGS. 3A and 3B that are used as part of a gate-last semiconductor fabrication process, step 304 is performed. At step 304, prior to formation of the transistors' metal gates, the transistors' source and drain diffusion regions are formed. In step 304, the source and drain diffusion regions of the PFET and the NFET may be formed using techniques known to one of ordinary skill in the art or otherwise suitable for forming drain and source diffusion regions in a gate-last semiconductor fabrication process. In some embodiments, 'dummy' (e.g., temporary) gates may be formed (e.g., to facilitate a self-alignment of a transistor's drain and source regions with the transistor's gate). For example, dummy gates may be formed on a substrate of the integrated circuit in regions corresponding to the gates of the NFET and PFET. A dummy gate may be formed from any material known to one of ordinary skill in the art or otherwise suitable for forming a temporary gate, including but not limited to polysilicon. In some embodiments, the dummy gates may be fully or partially covered by gate-covering layers. For example, spacer layers may be formed adjacent to the sidewalls of the dummy gates.

Following the formation of the dummy gates and gate-covering layers, dopants may be implanted into the integrated circuit substrate in the source and drain regions of the NFET and PFET, the implanted dopants may be activated, and the dummy gate may be removed. The implantation of dopants, activation of dopants, and removal of the dummy gate may be carried out using any techniques known to one of ordinary skill in the art or otherwise suitable for implanting dopants, activating dopants, or removing materials from an integrated circuit. For example, the dopants may be activated by annealing the integrated circuit, and the dummy gate may be removed by etching.

Figure 4A:
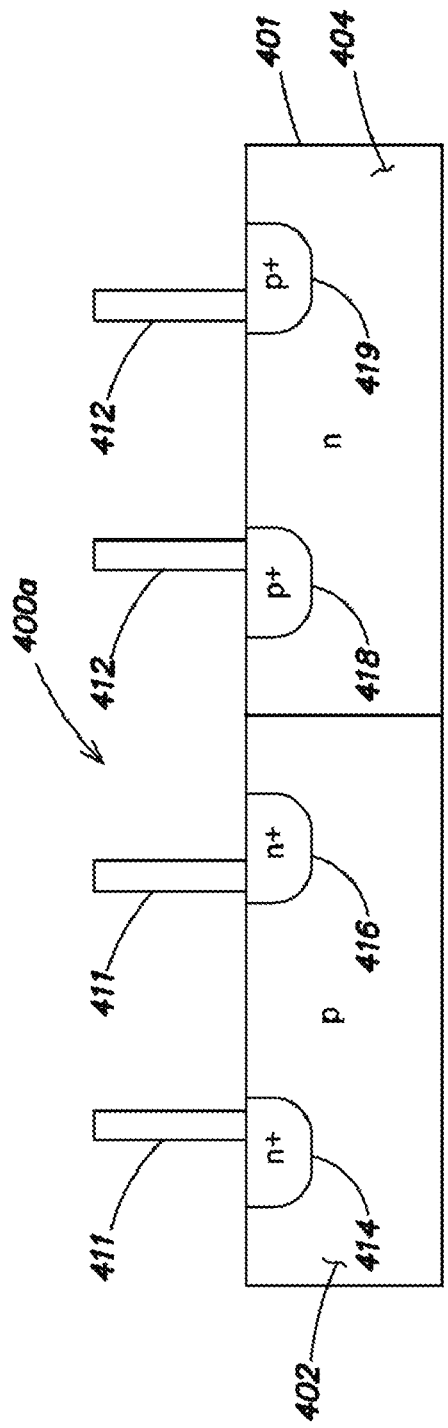
FIG. 4A shows a portion of an integrated circuit 400a after formation of source and drain diffusion regions, according to some embodiments.

FIG. 4A shows a portion of an integrated circuit 400a after formation of source and drain diffusion regions in step 304, according to some embodiments. In the embodiment of FIG. 4A, integrated circuit 400a includes a substrate 401 (e.g., a bulk silicon substrate). In some embodiments, substrate 401 may be an n-type substrate, region 402 may be a p-well formed in the substrate 401, and region 404 may be a portion of the substrate 401. In some embodiments, substrate 401 may be a p-type substrate, region 402 may be a portion of substrate 401, and region 404 may be an n-well formed in substrate 401. In some embodiments, regions 402 and 404 may be fully or partially isolated from each other (e.g., by shallow trench isolation). Embodiments are not limited by the type of substrate (e.g., bulk, SOI, SSDOI, HOI, etc.), the substrate material (e.g., silicon, germanium, etc.), or the type of isolation. In the embodiment of FIG. 4, gate-covering layers 411 are formed in a region of the integrated circuit 400a corresponding to the gate of an NFET, and gate-covering layers 412 are formed in a region of the integrated circuit 400a corresponding to the gate of a PFET.

In the embodiment of FIG. 4A, substrate 401 includes source 414 and drain 416 regions of an NFET, as well as source 418 and drain 419 regions of PFET. In some embodiments, the source and drain diffusion regions (414, 416) of the NFET may be implanted ("doped") or heavily implanted ("heavily doped") with n-type dopants. In some embodiments, the source and drain diffusion regions (418, 419) of the PFET may be implanted ("doped") or heavily implanted ("heavily doped") with p-type dopants. Although the drains and sources illustrated in FIG. 4 are not raised, embodiments are not limited in this regard. In some embodiments, one or more of the NFET source 414, NFET drain 416, PFET source 418, or PFET drain 419 may be raised.

II. Gate-First Embodiments of the Method of Forming Semiconductor Devices

In some embodiments, the method of FIGS. 3A and 3B may be used to form, on an integrated circuit and as part of a gate-first semiconductor fabrication process, a metal-gate PFET with a compressively strained channel and a metal-gate NFET with a tensilely strained channel. In a gate-first semiconductor fabrication process, a transistor's gate is formed before the transistor's source and drain diffusion regions are formed.

In embodiments of FIGS. 3A and 3B that are used as part of a gate-first semiconductor fabrication process, step 336 is performed. At step 336, subsequent to formation of the transistors' metal gates, the transistors' source and drain diffusion regions are formed using techniques known to one of ordinary skill in the art or otherwise suitable for forming drain and source diffusion regions in a gate-first semiconductor fabrication process. In some embodiments of step 336, source and drain diffusion regions may be formed by implanting dopants into the integrated circuit substrate in the source and drain regions of the NFET and PFET, and by activating the implanted dopants. The implantation and activation of dopants may be carried out using any techniques known to one of ordinary skill in the art or otherwise suitable for implanting and activating dopants.

In some embodiments of step 336, the gates may be fully or partially covered by gate-covering layers. In some embodiments, gate-covering layers 413 and 415 may include a same material deposited in a same step of an integrated circuit fabrication process.

Figure 4B:
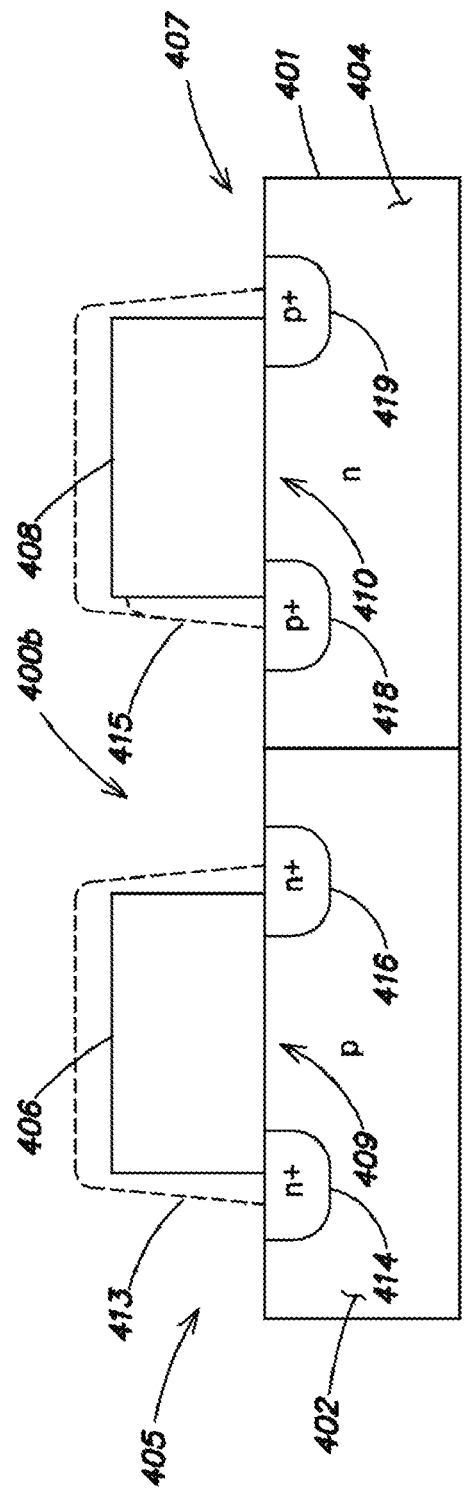
FIG. 4B shows a portion of an integrated circuit 400b after formation of source and drain diffusion regions, according to some embodiments.

FIG. 4B shows a portion of an integrated circuit 400b after formation of source and drain diffusion regions in step 336, according to some embodiments. Many elements of integrated circuit 400b shown in FIG. 4B have already been described above with reference to FIG. 4A. For brevity, descriptions of such elements are not repeated here.

In the embodiment of FIG. 4B, NFET 405 and PFET 407 include gates 406 and 408, respectively. In some embodiments, either gate or both gates may include a metallic material. In some embodiments, NFET gate 406 may be fully or partially covered by a gate-covering layer 413, and NFET gate 408 may be fully or partially covered by a gate-covering layer 415.

III. An Embodiment of a Method of Forming Semiconductor Devices

In some embodiments, the method of FIGS. 3A and 3B may be used to form, on an integrated circuit and as part of a gate-last process or a gate-first process, a metal-gate PFET with a compressively strained channel and a metal-gate NFET with a tensilely strained channel, wherein the metal gates' metallic portions include the same material(s), and wherein the PFET gate or the NFET gate has a work-function layer, but the other type of gate does not. In some embodiments, formation of such a metal-gate PFET and a metal-gate NFET may include steps 306, 308, 312, 314, and 333 of the method illustrated in FIGS. 3A and 3B.

At step 306, a dielectric layer is deposited over portions of the integrated circuit corresponding to the PFET and the NFET. The dielectric layer may be deposited using any technique known to one of ordinary skill in the art or otherwise suitable for depositing a dielectric material. The dielectric layer may include, for example, a high-k dielectric material such as silicon dioxide ($SiO_2$).

At step 308, a first metallic layer is deposited over the portions of the integrated circuit corresponding to the PFET and the NFET. The first metallic layer may be deposited using any technique known to one of ordinary skill in the art or otherwise suitable for depositing a metallic material, including but not limited to physical vapor deposition (e.g., cathodic arc deposition). In some embodiments, the first metallic layer may function as a work-function layer. The first metallic layer may include, for example, a metal carbide and/or a metal nitride.

At step 312, the first metallic layer (e.g., work-function layer) is removed from a portion of the integrated circuit corresponding to the PFET or the NFET. The first metallic layer may be removed from the selected portion of the integrated circuit using any technique known to one of ordinary skill in the art or otherwise suitable for selectively removing a metallic material from an integrated circuit, including but not limited to photolithographic patterning, dry etching, wet etching, reactive ion etching, isotropic etching, anisotropic etching, etc.

At step 314, a second metallic layer is deposited over the portions of the integrated circuit corresponding to the PFET and the NFET. The second metallic layer may be deposited using any technique known to one of ordinary skill in the art or otherwise suitable for depositing a metallic material. In some embodiments, the second metallic layer may include material(s) suitable for use as a metallic portion of a metal gate. The second metallic layer may include, for example, aluminum (Al), tungsten (W), and/or copper (Cu).

At step 333, portions of the dielectric layer, metallic layers, and/or gate-covering layers which do not correspond to the gates of the PFET and NFET may be removed, such that the remaining gates of the PFET and the NFET remain. Portions of one or more of these layers may be removed using any technique known to one of ordinary skill in the art or otherwise suitable for selectively removing such materials from an integrated circuit. For example, photolithographic patterning, dry etching, wet etching, reactive ion etching, isotropic etching, or anisotropic etching may be used to remove portions of these layers from areas of the integrated circuit other than the gates of the PFET and NFET.

FIG. 5A shows a metal-gate PFET and a metal-gate NFET formed on an integrated circuit 400a as part of a gate-last process using steps 304, 306, 308, 312, 314, and 333 of the method illustrated in FIGS. 3A and 3B, according to some embodiments. Many elements of integrated circuit 400a shown in FIG. 5A have already been described above with reference to FIG. 4A. For brevity, descriptions of such elements are not repeated here.

In the embodiment of FIG. 5A, NFET 405 includes a gate 406, a source diffusion region 414, a drain diffusion region 416, a channel region 409, and a body. The body is formed in region 402 of substrate 401. Channel 409 may occupy portions of substrate 401 between source 414 and drain 416 under gate 406. In some embodiments, channel 409 may be tensilely strained. In the embodiment of FIG. 5A, gate 406 of metal-gate NFET 405 includes dielectric layer 420 (deposited in step 306 of the method of FIGS. 3A and 3B) and second metallic layer 422 (deposited in step 314). Second metallic layer 422 may function as a metallic portion of gate 406. In some embodiments, gate 406 may apply tensile stress to channel 409. In some embodiments, gate 406 may also include or be fully or partially covered by gate-covering layer 411. In some embodiments, gate-covering layer 411 may be removed during fabrication of the integrated circuit (e.g., during step 333 of the method of FIGS. 3A and 3B).

In the embodiment of FIG. 5A, PFET 407 includes a gate 408, a source diffusion region 418, a drain diffusion region 419, a channel region 410, and body. The body is formed in region 404 of substrate 401. Channel 410 may occupy portions of substrate 401 between source 418 and drain 419 under gate 408. In some embodiments, channel 410 may be compressively strained. In the embodiment of FIG. 5A, gate 408 of metal-gate PFET 407 includes dielectric layer 420 (deposited in step 306 of the method of FIGS. 3A and 3B), first metallic layer 421 (deposited in step 308), and second metallic layer 422 (deposited in step 314). First metallic layer 421 may function as a work-function layer, and second metallic layer 422 may function as a metallic portion of gate 408. In some embodiments, gate 408 may apply compressive stress to channel 410. In some embodiments, gate 408 may include or be fully or partially covered by gate-covering layer 412. In some embodiments, gate-covering layer 412 may be removed during fabrication of the integrated circuit (e.g., during step 333 of the method of FIGS. 3A and 3B).

FIG. 5B shows a metal-gate PFET and a metal-gate NFET formed on an integrated circuit 400b as part of a gate-first process using steps 306, 308, 312, 314, 333, and 336 of the method illustrated in FIGS. 3A and 3B, according to some embodiments. The elements of integrated circuit 400b shown in FIG. 5B have already been described above with reference to FIGS. 4B and 5A. For brevity, descriptions of such elements are not repeated here.

Thus, each integrated circuit (400a, 400b) of FIGS. 5A and 5B includes a metal-gate NFET with a tensilely-strained channel and a metal gate PFET with a compressively-strained channel. In some embodiments, the gates of the metal-gate NFET and PFET collectively include three or fewer metallic materials. For example, in some embodiments, the gate of the metal-gate NFET includes one metallic material (second metallic layer 422), and the gate of metal-gate PFET includes two metallic materials (first metallic layer 421 and second metallic layer 422). Also, in some embodiments, the gates of the metal-gate NFET and PFET share a metallic material (e.g., second metallic layer 422). In some embodiments, the metallic material shared by the gates of the NFET and PFET may be deposited on the integrated circuit in a same processing step of an integrated circuit fabrication process.

IV. Another Embodiment of a Method of Forming Semiconductor Devices

In some embodiments, the method of FIGS. 3A and 3B may be used to form, on the integrated circuit and as part of a gate-last process or a gate-first process, a metal-gate PFET with a compressively strained channel and a metal-gate NFET with a tensilely strained channel, wherein the metallic portions of the metal gates include different materials and the PFET gate or the NFET gate has a work-function layer, but the other type of gate does not. In some embodiments, formation of such a metal-gate PFET and metal-gate NFET may include steps 306, 308, 312, 314, 318, 320, 323, and 333 of the method illustrated in FIGS. 3A and 3B.

Embodiments of steps 306, 308, 312, 314, and 333 suitable for use in forming such a metal-gate PFET and metal-gate NFET are described above in Section III with reference to the method of FIGS. 3A and 3B. In the interest of brevity, descriptions of these steps are not repeated here.

At step 318, the second metallic layer is removed from a portion of the integrated circuit corresponding to the PFET or the NFET. The second metallic layer may be removed from the selected portion of the integrated circuit using any technique known to one of ordinary skill in the art or otherwise suitable for selectively removing a metallic material from an integrated circuit, including but not limited to photolithographic patterning, dry etching, wet etching, reactive ion etching, isotropic etching, anisotropic etching, etc.

At step 320, a third metallic layer is deposited over the portions of the integrated circuit corresponding to the PFET and the NFET. The third metallic layer may be deposited using any technique known to one of ordinary skill in the art or otherwise suitable for depositing a metallic material. In some embodiments, the second metallic layer may function as a metallic layer of a metal gate. The third metallic layer may include, for example, aluminum (Al), tungsten (W), and/or copper (Cu).

At step 323, the third metallic layer is removed from a portion of the integrated circuit corresponding to the PFET or the NFET, such that the second metallic layer remains over the portion of the integrated circuit corresponding to one of the PFET or the NFET, and the third metallic layer remains over the portion of the integrated circuit corresponding to the other of the PFET or NFET. The third metallic layer may be removed from the selected portion of the integrated circuit using any technique known to one of ordinary skill in the art or otherwise suitable for selectively removing a metallic material from an integrated circuit, including but not limited to photolithographic patterning, dry etching, wet etching, reactive ion etching, isotropic etching, anisotropic etching, etc.

FIG. 6A shows a metal-gate PFET and a metal-gate NFET formed on an integrated circuit 400a as part of a gate-last fabrication process using steps 304, 306, 308, 312, 314, 318, 320, 323, and 333 of the method illustrated in FIGS. 3A and 3B, according to some embodiments. Many elements of integrated circuit 400*a* shown in FIG. 6A have already been described above with reference to FIGS. 4A and/or 5A. For brevity, descriptions of such elements are not repeated here.

In the embodiment of FIG. 6A, gate 406 of metal-gate NFET 405 includes dielectric layer 420 (deposited in step 306 of the method of FIGS. 3A and 3B) and second metallic layer 422 (deposited in step 314). Second metallic layer 422 may function as a metallic portion of gate 406. In some embodiments, gate 406 may apply tensile stress to channel 409. In some embodiments, gate 406 may include or be fully or partially covered by gate-covering layer 411. In some embodiments, gate-covering layer 411 may be removed during fabrication of the integrated circuit (e.g., during step 333 of the method of FIGS. 3A and 3B).

In the embodiment of FIG. 6A, gate 408 of metal-gate PFET 407 includes dielectric layer 420 (deposited in step 306 of the method of FIGS. 3A and 3B), first metallic layer 421 (deposited in step 308), and third metallic layer 423 (deposited in step 320). First metallic layer 421 may function as a work-function layer, and third metallic layer 423 may function as a metallic portion of gate 408. In some embodiments, gate 408 may apply compressive stress to channel 410. In some embodiments, gate 408 may include or be fully or partially covered by gate-covering layer 412. In some embodiments, gate-covering layer 412 may be removed during fabrication of the integrated circuit (e.g., during step 333 of the method of FIGS. 3A and 3B).

FIG. 6B shows a metal-gate PFET and a metal-gate NFET formed on an integrated circuit 400*b* as part of a gate-first process using steps 306, 308, 312, 314, 318, 320, 323, 333, and 336 of the method illustrated in FIGS. 3A and 3B, according to some embodiments. The elements of integrated circuit 400*b* shown in FIG. 6B have already been described above with reference to FIGS. 4B and 6A. For brevity, descriptions of such elements are not repeated here.

Thus, each integrated circuit (400*a*, 400*b*) of FIGS. 6A and 6B includes a metal-gate NFET with a tensilely-strained channel and a metal-gate PFET with a compressively-strained channel. In some embodiments, the gates of the metal-gate NFET and PFET collectively include three or fewer metallic materials. For example, in some embodiments, the gate of the metal-gate NFET includes one metallic material (second metallic layer 422), and the gate of metal-gate PFET includes two metallic materials (first metallic layer 421 and third metallic layer 423).

V. Another Embodiment of a Method of Forming Semiconductor Devices

In some embodiments, the method of FIGS. 3A and 3B may be used to form, on the integrated circuit and as part of a gate-last or a gate-first process, a metal-gate PFET with a compressively strained channel and a metal-gate NFET with a tensilely strained channel, wherein the metal gates have different work-function layers, and wherein the metal gates' metallic portions include the same materials. In some embodiments, formation of such a metal-gate PFET and metal-gate NFET may include steps 306, 308, 312, 314, 318, 320, and 333 of the method illustrated in FIGS. 3A and 3B.

Embodiments of steps 306, 308, and 312 suitable for use in forming such a metal-gate PFET and metal-gate NFET are described above in Section III with reference to the method of FIGS. 3A and 3B. Embodiments of steps 320 and 333 suitable for use in forming such a metal-gate PFET and metal-gate NFET are described above in Sections III and IV, respectively, with reference to the method of FIGS. 3A and 3B. In the interest of brevity, descriptions of these steps are not repeated here.

At step 314, a second metallic layer is deposited over the portions of the integrated circuit corresponding to the PFET and the NFET. The second metallic layer may be deposited using any technique known to one of ordinary skill in the art or otherwise suitable for depositing a metallic material, including but not limited to physical vapor deposition (e.g., cathodic arch deposition). In some embodiments, the second metallic layer may function as a work-function layer. The second metallic layer may include, for example, a metal carbide and/or a metal nitride.

At step 318, the second metallic layer (e.g., work-function layer) is removed from a portion of the integrated circuit corresponding to the PFET or the NFET, such that the first metallic layer remains over the portion of the integrated circuit corresponding to one of the PFET or the NFET, and the second metallic layer remains over the portion of the integrated circuit corresponding to the other of the PFET or NFET. The second metallic layer may be removed from the selected portion of the integrated circuit using any technique known to one of ordinary skill in the art or otherwise suitable for selectively removing a metallic material from an integrated circuit, including but not limited to photolithographic patterning, dry etching, wet etching, reactive ion etching, isotropic etching, anisotropic etching, etc.

FIG. 7A shows a metal-gate PFET and a metal-gate NFET formed on an integrated circuit 400*a* as part of a gate-last fabrication process using steps 304, 306, 308, 312, 314, 318, 320, and 333 of the method illustrated in FIGS. 3A and 3B, according to some embodiments. Many dements of integrated circuit 400*a* shown in FIG. 7A have already been described above with reference to FIGS. 4A and 5A. For brevity, descriptions of such elements are not repeated here.

In the embodiment of FIG. 7A, gate 406 of metal-gate NFET 405 includes dielectric layer 420 (deposited in step 306 of the method of FIGS. 3A and 3B), second metallic layer 422 (deposited in step 314), and third metallic layer 423 (deposited in step 320). Second metallic layer 422 may function as a work-function layer of gate 406. Third metallic layer 423 may function as a metallic portion of gate 406. In some embodiments, gate 406 may apply tensile stress to channel 409. In some embodiments, gate 406 may include or be fully or partially covered by gate-covering layer 411.

In the embodiment of FIG. 7A, gate 408 of metal-gate PFET 407 includes dielectric layer 420 (deposited in step 306 of the method of FIGS. 3A and 3B), first metallic layer 421 (deposited in step 308), and third metallic layer 423 (deposited in step 320). First metallic layer 421 may function as a work-function layer, and third metallic layer 423 may function as a metallic portion of gate 408. In some embodiments, gate 408 may apply compressive stress to channel 410. In some embodiments, gate 408 may include or be fully or partially covered by gate-covering layer 412.

FIG. 7B shows a metal-gate PFET and a metal-gate NFET formed on an integrated circuit 400*b* as part of a gate-first process using steps 306, 308, 312, 314, 318, 320, 333, and 336 of the method illustrated in FIGS. 3A and 3B, according to some embodiments. The elements of integrated circuit 400*b* shown in FIG. 7B have already been described above with reference to FIGS. 4B and 7A. For brevity, descriptions of such elements are not repeated here.

Thus, each integrated circuit (400*a*, 400*b*) of FIGS. 7A and 7B includes a metal-gate NFET with a tensilely-strained channel and a metal gate PFET with a compressively-strained channel. In some embodiments, the gates of the metal-gate NFET and PFET collectively include three or fewer metallic materials. For example, in some embodiments, the gate of the metal-gate NFET includes second metallic layer 422, the gate of metal-gate PFET includes first metallic layer 421, and the gates of both FETs include third metallic layer 423. Also, in some embodiments, the gates of the metal-gate NFET and PFET share a metallic material (e.g., third metallic layer 423). In some embodiments, the metallic material shared by the gates of the NFET and PFET may be deposited on the integrated circuit in a same processing step of an integrated circuit fabrication process.

VI. Another Embodiment of a Method of Forming Semiconductor Devices

In some embodiments, the method of FIGS. 3A and 3B may be used to form, on an integrated circuit and as part of a gate-last process or a gate-first process, a metal-gate PFET with a compressively strained channel and a metal-gate NFET with a tensilely strained channel, wherein the metal gates have the same work-function layers and different metallic layers. In some embodiments, formation of such a metal-gate PFET and metal-gate NFET may include steps 306, 308, 324, 328, 330, 332, and 333 of the method illustrated in FIGS. 3A and 3B.

Embodiments of steps 306, 308, and 333 suitable for use in forming such a metal-gate PFET and metal-gate NFET are described above in Section III with reference to the method of FIGS. 3A and 3B. In the interest of brevity, descriptions of these steps are not repeated here.

At step 324, a second metallic layer is deposited over the portions of the integrated circuit corresponding to the PFET and the NFET. The second metallic layer may be deposited using any technique known to one of ordinary skill in the art or otherwise suitable for depositing a metallic material. In some embodiments, the second metallic layer may function as a metallic portion of a metal gate. The second metallic layer may include, for example, aluminum (Al), tungsten (W), and/or copper (Cu).

At step 328, the second metallic layer is removed from a portion of the integrated circuit corresponding to the PFET or the NFET. The second metallic layer may be removed from the selected portion of the integrated circuit using any technique known to one of ordinary skill in the art or otherwise suitable for selectively removing a metallic material from an integrated circuit, including but not limited to photolithographic patterning, dry etching, wet etching, reactive ion etching, isotropic etching, anisotropic etching, etc.

At step 330, a third metallic layer is deposited over the portions of the integrated circuit corresponding to the PFET and the NFET. The third metallic layer may be deposited using any technique known to one of ordinary skill in the art or otherwise suitable for depositing a metallic material. In some embodiments, the third metallic layer may function as a metallic layer of a metal gate. The second metallic layer may include, for example, aluminum (Al), tungsten (W), and/or copper (Cu).

At step 332, the third metallic layer is removed from a portion of the integrated circuit corresponding to the PFET or the NFET, such that the second metallic layer remains over the portion of the integrated circuit corresponding to one of the PFET or the NFET, and the third metallic layer remains over the portion of the integrated circuit corresponding to the other of the PFET or NFET. The third metallic layer may be removed from the selected portion of the integrated circuit using any technique known to one of ordinary skill in the art or otherwise suitable for selectively removing a metallic material from an integrated circuit, including but not limited to photolithographic patterning, dry etching, wet etching, reactive ion etching, isotropic etching, anisotropic etching, etc.

FIG. 8A shows a metal-gate PFET and a metal-gate NFET formed on an integrated circuit 400a as part of a gate-last fabrication process using steps 304, 306, 308, 324, 328, 330, 332, and 333 of the method illustrated in FIGS. 3A and 3B, according to some embodiments. Many elements of integrated circuit 400a shown in FIG. 8A have already been described above with reference to FIGS. 4A and 5A. For brevity, descriptions of such elements are not repeated here.

In the embodiment of FIG. 8A, gate 406 of metal-gate NFET 405 includes dielectric layer 420 (deposited in step 306 of the method of FIGS. 3A and 3B), first metallic layer 421 (deposited in step 308), and third metallic layer 423 (deposited in step 330). First metallic layer 421 may function as a work-function layer, and third metallic layer 423 may function as a metallic portion of gate 406. In some embodiments, gate 406 may apply tensile stress to channel 409. In some embodiments, gate 406 may include or be fully or partially covered by gate-covering layer 411.

In the embodiment of FIG. 8A, gate 408 of metal-gate PFET 407 includes dielectric layer 420 (deposited in step 306 of the method of FIGS. 3A and 3B), first metallic layer 421 (deposited in step 308), and second metallic layer 422 (deposited in step 324). First metallic layer 421 may function as a work-function layer, and second metallic layer 422 may function as a metallic portion of gate 408. In some embodiments, gate 408 may apply compressive stress to channel 410. In some embodiments, gate 408 may include or be fully or partially covered by gate-covering layer 412.

FIG. 8B shows a metal-gate PFET and a metal-gate NFET formed on an integrated circuit 400b as part of a gate-first process using steps 306, 308, 324, 328, 330, 332, 333, and 336 of the method illustrated in FIGS. 3A and 3B, according to some embodiments. The elements of integrated circuit 400b shown in FIG. 8B have already been described above with reference to FIGS. 4B and 8A. For brevity, descriptions of such elements are not repeated here.

Thus, each integrated circuit (400a, 400b) of FIGS. 8A and 8B includes a metal-gate NFET with a tensilely-strained channel and a metal gate PFET with a compressively-strained channel. In some embodiments, the gates of the metal-gate NFET and PFET collectively include three or fewer metallic materials. For example, in some embodiments, the gate of the metal-gate NFET includes third metallic layer 423 (a metallic material), the gate of metal-gate PFET includes second metallic layer 422 (another metallic material), and the gates of both FETs include first metallic layer 421 (a third metallic material). Also, in some embodiments, the gates of the metal-gate NFET and PFET share a metallic material (e.g., first metallic layer 421). In some embodiments, the metallic material shared by the gates of the NFET and PFET may be deposited on the integrated circuit in a same processing step of an integrated circuit fabrication process.

VII. Another Embodiment of a Method of Forming Semiconductor Devices

In some embodiments, the method of FIGS. 3A and 3B may be used to form, on the integrated circuit and as part of a gate-last process or a gate-first process, a metal-gate PFET with a compressively strained channel and a metal-gate NFET with a tensilely strained channel, wherein the metal gates have the same work-function layers and the same metallic layers. In some embodiments, formation of such a metal-gate PFET and metal-gate NFET may include steps 306, 308, 324, and 333 of the method illustrated in FIGS. 3A and 3B.

Embodiments of steps 306, 308, 324, and 333 suitable for use in forming such a metal-gate PFET and metal-gate NFET are described above in Section VI of the method of FIGS. 3A and 3B. In the interest of brevity, descriptions of these steps are not repeated here.

FIG. 9A shows a metal-gate PFET and a metal-gate NFET formed on an integrated circuit 400a as part of a gate-last fabrication process using steps 304, 306, 308, 324, and 333 of the method illustrated in FIGS. 3A and 3B, according to some embodiments. Many elements of integrated circuit 400a shown in FIG. 9A have already been described above with reference to FIGS. 4A and 5A. For brevity, descriptions of such elements are not repeated here.

In the embodiment of FIG. 9A, gate 406 of metal-gate NFET 405 includes dielectric layer 420 (deposited in step 306 of the method of FIGS. 3A and 3B), first metallic layer 421 (deposited in step 308), and second metallic layer 422 (deposited in step 324). First metallic layer 421 may function as a work-function layer, and second metallic layer 422 may function as a metallic portion of gate 406. In some embodiments, gate 406 may apply tensile stress to channel 409. In some embodiments, gate 406 may include or be fully or partially covered by gate-covering layer 411.

In the embodiment of FIG. 9A, gate 408 of metal-gate PFET 407 includes dielectric layer 420 (deposited in step 306 of the method of FIGS. 3A and 3B), first metallic layer 421 (deposited in step 308), and second metallic layer 422 (deposited in step 324). First metallic layer 421 may function as a work-function layer, and second metallic layer 422 may function as a metallic portion of gate 408. In some embodiments, gate 408 may apply compressive stress to channel 410. In some embodiments, gate 408 may include or be fully or partially covered by gate-covering layer 412.

FIG. 9B shows a metal-gate PFET and a metal-gate NFET formed on an integrated circuit 400b as part of a gate-first process using steps 306, 308, 324, 333, and 336 of the method illustrated in FIGS. 3A and 3B, according to some embodiments. The elements of integrated circuit 400b shown in FIG. 9B have already been described above with reference to FIGS. 4B and 9A. For brevity, descriptions of such elements are not repeated here.

Thus, each integrated circuit (400a, 400b) of FIGS. 9A and 9B includes a metal-gate NFET with a tensilely-strained channel and a metal gate PFET with a compressively-strained channel. In some embodiments, the gates of the metal-gate NFET and PFET collectively include three or fewer metallic materials. For example, in some embodiments, the gates of the NFET and PFET collectively include first metallic layer 421 (a metallic material) and second metallic layer 422 (a second metallic material). Also, in some embodiments, the gates of the metal-gate NFET and PFET share a metallic material (e.g., first metallic layer 421 and/or second metallic layer 422). In some embodiments, a metallic material shared by the gates of the NFET and PFET may be deposited on the integrated circuit in a same processing step of an integrated circuit fabrication process.

As illustrated by the examples above, embodiments of the method of FIGS. 3A and 3B may include subsets of the steps illustrated in FIGS. 3A and 3B. Some embodiments may include a single step illustrated in FIGS. 3A and 3B. In embodiments of the method that include two or more of the steps illustrated in FIGS. 3A and 3B, the steps are not necessarily performed in the order shown in FIGS. 3A and 3B. For example, in some embodiments, steps 320 and 323 could be performed prior to steps 314 and 318.

Although the foregoing disclosure refers to NFETs and PFETs as examples of semiconductor devices, embodiments are not limited in this regard. The techniques described herein may be used to enhance the mobility of charge carriers in any semiconductor device known to one of ordinary skill in the art or otherwise suitable for operating with enhanced-mobility charge carriers, including but not limited to any electrical device, MEMS (micro-electromechanical system) device, optoelectronic device, etc.

In some embodiments, a work-function layer comprising TiN with a thickness of 400 angstrom (Å), deposited by cathodic arc deposition with cathode supplied at 12 kW DC, may perform well as a work-function layer for a metal-gate PFET, and provide a good balance between the stress and density of the work-function layer.

Embodiments described in the present disclosure may be included in any electronic device, including but not limited to a microprocessor, a mobile electronic device, a mobile phone, a smart phone, a tablet computer, a laptop computer, a desktop computer, or a server.

Terms used herein to describe positioning relationships of structural elements, such as "over," "under," "beside," and "adjacent to," should not be construed as requiring the structural elements to be in contact with each other or directly related (e.g., "over" should not be construed to mean "directly over" or to require that no other structures intervene between structure A and structure B when structure A is described as being "over" structure B), even where some or all embodiments of the structural elements illustrated in the Figures show the structural elements being in contact with each other and/or positioned without any structures intervening between them.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

The invention claimed is:

1. An integrated circuit, comprising:
   a p-type semiconductor device including:
      a first strained channel;
      a first gate that applies stress to the first strained channel, the first gate including:
         a first U-shaped dielectric layer having a first vertical portion and a second vertical portion that are connected by a first horizontal portion,
         a first metallic layer in direct contact with a surface of the first vertical portion, a surface of the second vertical portion, and a surface of the first horizontal portion of the first U-shaped dielectric layer, the first metallic layer including aluminum, tungsten, copper, a metal carbide, or a combination thereof, and
         a second metallic layer in direct contact with a surface of the first metallic layer; and a first spacer adjacent to sidewalls of the first gate; and
an n-type semiconductor device including:
  a second strained channel;
  a second gate that applies stress to the second strained channel, the second gate including:
    a second U-shaped dielectric layer having a third vertical portion and a fourth vertical portion that are connected by a second horizonatal portion,
    a third metallic layer in direct contact with a surface of the third vertical portion, a surface of the fourth vertical portion, and a surface of the second horizontal portion of the second U-shaped dielectric layer, and
    the second metallic layer in direct contact with a surface of the third metallic layer; and
  a second spacer adjacent to sidewalls of the second gate.

2. The integrated circuit of claim 1 wherein the first strained channel is compressively strained and the second strained channel is tensiley strained.

3. The integrated circuit of claim 1 wherein the first spacer is continuous and wraps around four vertical sides of the first gate, and the second spacer is continuous and wraps around four vertical sides of the second gate.

4. The integrated circuit of claim 1 wherein the first strained channel or the second strained channel is strained in a horizontal direction.

5. The integrated circuit of claim 1 wherein the first strained channel or the second strained channel is strained in a vertical direction.

6. The integrated circuit of claim 1 wherein the first spacer covers a top of the first gate and the second spacer covers a top of the second gate.

7. The integrated circuit of claim 1 wherein the first spacer and the second spacer have straight vertical profiles.

8. An integrated circuit, comprising:
  a substrate;
  a p-type source region on the substrate;
  a p-type drain region on the substrate;
  a first channel region extending between the p-type source region and the p-type drain region;
  a first gate including:
    a first U-shaped dielectric layer having a first vertical portion and a second vertical portion that are connected by a first horizontal portion, the first U-shaped dielectric layer having a surface,
    a first metallic layer having a first uniform composition throughout and abutting the surface of the first vertical portion, the second vertical portion, and the first horizontal portion of the first U-shaped dielectric layer, the first metallic layer including aluminum, tungsten, copper, a metal carbide, or a combination thereof, and
    a second metallic layer having a second uniform composition throughout and abutting a surface of the first metallic layer;
  a first continuous spacer wrapping around four vertical sides of the first gate;
  an n-type source region on the substrate;
  an n-type drain region on the substrate;
  a second channel region extending between the n-type source region and the n-type drain region;
  a second gate including:
    a second U-shaped dielectric layer having a third vertical portion and a fourth vertical portion that are connected by a second horizontal portion, the second U-shaped dielectric layer having a surface,
    a third metallic layer having a third uniform composition throughout and abutting the surface of the third vertical portion, a surface of the fourth vertical portion, and the second horizontal portion of the second U-shaped dielectric layer, the third metallic layer including a metal carbide, a metal nitride, or both, and
    the second metallic layer abutting a surface of the third metallic layer; and
  a second continuous spacer wrapping around four vertical sides of the second gate.

9. The integrated circuit of claim 8 wherein the first channel region is compressively strained in a first magnitude and a first orientation and the second channel region is tensiley strained in a second magnitude and a second orientation.

10. The integrated circuit of claim 8 wherein the first continuous spacer covers a top of the first gate and the second continuous spacer covers a top of the second gate.

11. The integrated circuit of claim 8 wherein the first channel region or the second channel region is strained in a horizontal direction.

12. The integrated circuit of claim 8 wherein the first channel region or the second channel region is strained in a vertical direction.

13. The integrated circuit of claim 8 wherein the first continuous spacer and the second continuous spacer have straight vertical profiles.

14. A method, comprising:
  forming a p-type source region and a p-type drain region on a semiconductor substrate;
  forming an n-type source region and an n-type drain region on the semiconductor substrate;
  forming a first spacer;
  forming a first metal gate structure including:
    forming a first U-shaped gate dielectric layer over a first channel region between the p-type source region and the p-type drain region, the first U-shaped gate dielectric layer having a first vertical portion and a second vertical portion that are connected by a first horizontal portion, the first and second vertical portions being adjacent to the first spacer;
    a first metallic layer having a first uniform composition throughout and in direct contact with a surface of the first vertical portion, the second vertical portion, and the first horizontal portion of the first U-shaped gate dielectric layer, the first metallic layer including aluminum, tungsten, copper, a metal carbide, or a combination thereof; and
    a second metallic layer having a second uniform composition throughout and in direct contact with a surface of the first metallic layer;
  forming a second spacer; and
  forming a second metal gate structure including:
    a second U-shaped gate dielectric layer over a second channel region between the n-type source region and the n-type drain region, the second U-shaped gate dielectric layer having a third vertical portion and a fourth vertical portion that are connected by a second horizontal portion, the third and fourth vertical portions being adjacent to the second spacer;
    a third metallic layer having a third uniform composition throughout and in direct contact with a surface of the third vertical portion, the fourth vertical portion, and the second horizontal portion of the second U-shaped gate dielectric layer; and the second metallic layer in direct contact with a surface of the third metallic layer.

15. The method of claim 14 wherein forming the first metal gate structure and forming the second metal gate structure comprises:

forming the first U-shaped gate dielectric layer over a first portion and the second U-shaped gate dielectric layer over a second portion of the semiconductor substrate, the first portion of the semiconductor substrate corresponding to a location over the p-type source region and the p-type drain region and the second portion of the semiconductor substrate corresponding to a location over the n-type source region and the n-type drain region;

forming the first metallic layer as a portion of the first metal gate structure and the second metal gate structure;

removing a portion of the first metallic layer from the second metal gate structure; and forming the second metallic layer as a portion of the first metal gate structure and the second metal gate structure.

16. The method of claim 14 wherein the first spacer is continuous and wraps around four vertical sides of the first metal gate structure, and the second spacer is continuous and wraps around four vertical sides of the second metal gate structure.

17. The method of claim 16, further comprising:

forming, prior to forming the first metal gate structure, a first polysilicon gate on the semiconductor substrate;

forming, prior to forming the second metal gate structure, a second polysilicon gate on the semiconductor substrate;

replacing the first polysilicon gate with the first metal gate structure; and replacing the second polysilicon gate with the second metal gate structure.

18. The method of claim 17 wherein replacing the first polysilicon gate includes forming the first U-shaped gate dielectric layer, the first metallic layer, and the second metallic layer in an area inside the first spacer; and wherein replacing the second polysilicon gate includes forming the second U-shaped gate dielectric layer and the second metallic layer in an area inside the second spacer.

19. The method of claim 14 wherein the first metal gate structure and the second metal gate structure are formed prior to forming the p-type source region, the p-type drain region, the n-type source region, and the n-type drain region.

20. The method of claim 14, further comprising forming a raised p-type source region and a raised p-type drain region in contact with the p-type source region and p-type drain region, respectively and forming a raised n-type source region and a raised n-type drain region in contact with the n-type source region and n-type drain region, respectively.

* * * * *